(12) United States Patent
Lee et al.

(10) Patent No.: US 9,957,609 B2
(45) Date of Patent: May 1, 2018

(54) PROCESS FOR MAKING OF GLASS ARTICLES WITH OPTICAL AND EASY-TO-CLEAN COATINGS

(71) Applicant: CORNING INCORPORATED, Corning, NY (US)

(72) Inventors: Christopher Morton Lee, Corning, NY (US); Xiao-feng Lu, Jiangmen (CN); Xu Ouyang, Painted Post, NY (US); Junhong Zhang, Fuzhou (CN)

(73) Assignee: CORNING INCORPORATED, Corning, NY (US)

( * ) Notice: Subject to any disclaimer, the term of this patent is extended or adjusted under 35 U.S.C. 154(b) by 786 days.

(21) Appl. No.: 13/906,038

(22) Filed: May 30, 2013

(65) Prior Publication Data

US 2013/0334031 A1    Dec. 19, 2013

Related U.S. Application Data

(63) Continuation-in-part of application No. 13/690,904, filed on Nov. 30, 2012.

(60) Provisional application No. 61/565,024, filed on Nov. 30, 2011.

(51) Int. Cl.
*C23C 14/56* (2006.01)
*C03C 17/34* (2006.01)
*C03C 17/42* (2006.01)

(52) U.S. Cl.
CPC ........ *C23C 14/568* (2013.01); *C03C 17/3482* (2013.01); *C03C 17/42* (2013.01); *C23C 14/56* (2013.01); *C03C 2217/76* (2013.01)

(58) Field of Classification Search
CPC . C03C 17/3482; C03C 17/42; C03C 2217/76; C23C 14/56; C23C 14/562; C23C 14/566; C23C 14/568
See application file for complete search history.

(56) References Cited

U.S. PATENT DOCUMENTS

| | | | |
|---|---|---|---|
| 4,851,095 A * | 7/1989 | Scobey | C23C 8/02 204/192.12 |
| 5,026,469 A | 6/1991 | Kunkel et al. | |
| 5,105,310 A | 4/1992 | Dickey | |
| 2,338,234 A | 1/1994 | Dimmick | 117/106 |
| 5,328,768 A | 7/1994 | Goodwin | |
| 5,352,294 A | 10/1994 | White et al. | 118/725 |

(Continued)

FOREIGN PATENT DOCUMENTS

| CA | 2082094 | 10/1996 |
|---|---|---|
| CN | 1244165 A | 2/2000 |

(Continued)

OTHER PUBLICATIONS

Derwent Abstract for U.S. Pat. No. 7,889,284.*

(Continued)

*Primary Examiner* — Michael A Band
(74) *Attorney, Agent, or Firm* — Kevin M Johnson

(57) ABSTRACT

A process in which both an optical coating, for example, an AR coating, and an ETC coating are deposited on a glass substrate article, in sequential steps, with the optical coating being deposited first and the ETC coating being deposited second, using the same apparatus and without exposing the article to the atmosphere at any time during the application of the optical coating and ETC coating.

13 Claims, 8 Drawing Sheets

(56) References Cited

U.S. PATENT DOCUMENTS

| | | | |
|---|---|---|---|
| 5,699,189 A | 12/1997 | Murphy | |
| 5,759,643 A | 6/1998 | Miyashita et al. | 428/1 |
| 5,783,299 A | 7/1998 | Miyashita et al. | 428/329 |
| 5,800,918 A | 9/1998 | Chartier et al. | 428/336 |
| 6,119,626 A | 9/2000 | Miyazawa et al. | 118/723 VE |
| 6,264,751 B1 | 7/2001 | Kamura et al. | 118/725 |
| 6,296,793 B1 | 10/2001 | Anthes et al. | 264/104 |
| 6,383,565 B1 | 5/2002 | Monaghan | 427/248.1 |
| 6,405,465 B2 | 6/2002 | Dwyer et al. | |
| 6,592,659 B1 | 7/2003 | Terrazas et al. | 106/287.13 |
| 6,863,965 B2 | 3/2005 | Fujinawa et al. | |
| 6,929,822 B2 | 8/2005 | Kono | 427/164 |
| 7,070,849 B2 | 7/2006 | Mori et al. | 428/141 |
| 7,294,731 B1 | 11/2007 | Flynn et al. | 556/427 |
| 7,508,567 B1 | 3/2009 | Clark | |
| 7,578,877 B2 | 8/2009 | Giessler et al. | 106/287.13 |
| 7,604,358 B2 | 10/2009 | Ninomiya et al. | 359/601 |
| 7,692,855 B2 | 4/2010 | Arrouy et al. | |
| 7,889,284 B1* | 2/2011 | Nemeth | G02F 1/13338 345/173 |
| 7,967,961 B2 | 6/2011 | Dogi et al. | |
| 8,211,544 B2 | 7/2012 | Itami et al. | 428/429 |
| 8,318,245 B2 | 11/2012 | Roisin et al. | 427/164 |
| 8,473,965 B2 | 6/2013 | Chaganti et al. | |
| 8,817,376 B2 | 8/2014 | Lee et al. | |
| 2001/0033893 A1 | 10/2001 | Anthes et al. | 427/162 |
| 2002/0050453 A1 | 5/2002 | Monaghan | 204/298.16 |
| 2002/0060848 A1 | 5/2002 | Mitsuishi et al. | 359/586 |
| 2003/0003227 A1 | 1/2003 | Kono | 427/162 |
| 2003/0116872 A1 | 6/2003 | Klemm et al. | |
| 2003/0165698 A1 | 9/2003 | Vaneeckhoutte et al. | 428/447 |
| 2003/0234460 A1 | 12/2003 | Hayashi et al. | 264/2.7 |
| 2004/0043260 A1 | 3/2004 | Nadaud et al. | 428/701 |
| 2004/0076750 A1 | 4/2004 | Boulineau et al. | 427/248.1 |
| 2004/0142185 A1 | 7/2004 | Takushima | 428/447 |
| 2004/0182701 A1 | 9/2004 | Miyamura | |
| 2005/0008778 A1 | 1/2005 | Utsugi et al. | |
| 2005/0158910 A1* | 7/2005 | Jiang | H01L 23/291 438/106 |
| 2006/0118408 A1* | 6/2006 | Myli | C03C 17/22 204/192.26 |
| 2006/0158738 A1 | 7/2006 | Nakamura et al. | 359/586 |
| 2006/0181774 A1 | 8/2006 | Ojima et al. | 359/586 |
| 2006/0269663 A1 | 11/2006 | Mori | |
| 2007/0104891 A1 | 5/2007 | Fournand | 427/561 |
| 2007/0184183 A1 | 8/2007 | Chu et al. | |
| 2007/0190342 A1 | 8/2007 | Teng | |
| 2008/0002260 A1 | 1/2008 | Arrouy et al. | |
| 2008/0007849 A1 | 1/2008 | Meschenmoser et al. | |
| 2008/0050600 A1 | 2/2008 | Fan et al. | 428/447 |
| 2008/0095999 A1 | 4/2008 | Yoshihara et al. | |
| 2008/0121335 A1 | 5/2008 | Kiuchi et al. | |
| 2008/0187766 A1 | 8/2008 | Heider et al. | 428/432 |
| 2008/0206470 A1 | 8/2008 | Thomas et al. | 427/402 |
| 2008/0213473 A1 | 9/2008 | Roisin et al. | 427/162 |
| 2008/0250955 A1 | 10/2008 | O'Brien | 101/216 |
| 2009/0098309 A1 | 4/2009 | Brody et al. | 427/534 |
| 2009/0104385 A1 | 4/2009 | Reymond et al. | |
| 2009/0197048 A1 | 8/2009 | Amin et al. | |
| 2009/0208728 A1 | 8/2009 | Itami et al. | 428/318.4 |
| 2009/0216035 A1 | 8/2009 | Itami et al. | 556/419 |
| 2009/0226610 A1 | 9/2009 | Koenig et al. | 427/248.1 |
| 2009/0257022 A1 | 10/2009 | Abe et al. | 351/166 |
| 2010/0053547 A1 | 3/2010 | Baude et al. | 351/159 |
| 2010/0062217 A1 | 3/2010 | Kurematsu | 428/141 |
| 2010/0173149 A1 | 7/2010 | Hung | 428/336 |
| 2010/0238557 A1 | 9/2010 | Tomoda | 359/586 |
| 2010/0304086 A1 | 12/2010 | Carre et al. | |
| 2011/0198219 A1* | 8/2011 | Ohmi | C23C 14/352 204/298.08 |
| 2011/0232749 A1 | 9/2011 | Lienhart et al. | |
| 2011/0305874 A1 | 12/2011 | Thoumazet et al. | 428/172 |
| 2012/0009429 A1 | 1/2012 | Shmueli et al. | 428/447 |
| 2012/0013845 A1 | 1/2012 | Conte et al. | 351/166 |
| 2012/0109591 A1 | 5/2012 | Thompson et al. | 703/1 |
| 2012/0162095 A1 | 6/2012 | Liang et al. | 345/173 |
| 2012/0275026 A1 | 11/2012 | Zhou et al. | 359/601 |
| 2013/0025503 A1 | 1/2013 | Park et al. | 106/287.12 |
| 2014/0113083 A1* | 4/2014 | Lee | G02B 1/111 427/569 |

FOREIGN PATENT DOCUMENTS

| | | | |
|---|---|---|---|
| CN | 1737192 | 2/2006 | |
| CN | 101512389 | 3/2011 | |
| EP | 614957 A1 | 9/1994 | B29D 11/00 |
| EP | 1136973 | 9/2001 | |
| EP | 1 255 129 | 11/2002 | |
| EP | 0933377 | 11/2004 | |
| EP | 1 630 261 | 3/2006 | |
| EP | 1328579 | 3/2012 | |
| JP | 50003454 | 1/1975 | |
| JP | 58-43402 | 3/1983 | |
| JP | 04147518 A * | 5/1992 | |
| JP | 6029332 B | 4/1994 | B32B 27/00 |
| JP | 07145481 A | 6/1995 | |
| JP | 10036142 | 2/1998 | |
| JP | 200180941 | 3/2001 | |
| JP | 2006-055731 | 3/2006 | |
| JP | 2006171204 A | 6/2006 | |
| JP | 2007240707 | 9/2007 | |
| JP | 20081869 | 1/2008 | |
| JP | 2009-299129 | 12/2009 | |
| TW | 201109459 A | 3/2011 | |
| WO | 2006/107083 A2 | 10/2006 | C07F 7/12 |
| WO | 2009043122 | 4/2009 | |
| WO | 2011/060047 | 5/2011 | C09D 183/12 |
| WO | 2012/064989 A1 | 5/2012 | C07F 7/14 |
| WO | 2012137744 | 10/2012 | |
| WO | 2012176990 | 12/2012 | |
| WO | 2013/099824 | 7/2013 | |
| WO | 2013121984 | 8/2013 | |
| WO | 2013121985 | 8/2013 | |
| WO | 2013121986 | 8/2013 | |

OTHER PUBLICATIONS

Derwent Abstract for US 2005/0158910.*
Patent Cooperation Treaty International Search Report for International Application No. PCT/US2012/067383; dated Jul. 8, 2013—11 pages.
Patent Cooperation Treaty International Search Report for International Application No. PCT/US2012/067370; dated Jul. 10, 2013—10 pages.
Machine translation WO2012176990.
Machine translation JP2001080941.
JP2014544942 Office Action dated Nov. 15, 2016, Japan Patent Office.
English Translation of JP2014544939 Office Action dated Dec. 27, 2016, Japan Patent Office.
Calottes R Willy, Practical Design and Production of Optical Thin Films; Mercel Dekker 1966, pp. 115-121.
Choy et al; Handbook of Nanostructured Materials and Nanotechnology, vol. 1: Synthesis and Processing. Academic Press; 2000. p. 533.
CN201280068319.7 Office Action dated Jan. 27, 2016.
CN201280068398.1 Office Action dated Feb. 1, 2016.
Fuchs et al, "Wetting & Surface Properties of (Modified) Fluoro-Silanised Glass" Colliods and Surfaces A: Physicochem Eng. Aspects 307 (2007) 7-15.
International Search Report and Written Opinion of the International Searching Authority; PCT/US2013/043415; dated Oct. 23, 2013.
"Kondo et al;""Durable Anti-Smudge Materials for Display Terminals"";http://www.findarticles.com/p/articles/mi qa5322/is 200906/ai n3212753 l/".
MacLeod, "Thin Film Optical Filters", 3rd Edition, Institute of Physics Publishing. Bristol and Philadelphia, 2001.

(56) References Cited

OTHER PUBLICATIONS

"Martinet et al; ""Deposition of SiO2 and TiO2 Thin Films by Plasma Enchanced Chemical Vapordeposition for Antireflection Coating""; Journal of Non-Crystalling Solids 216 (1997) 77-82".

* cited by examiner

PROCESS FOR MAKING OF GLASS ARTICLES WITH OPTICAL AND EASY-TO-CLEAN COATINGS

CROSS-REFERENCE TO RELATED APPLICATIONS

This application claims the benefit of priority under 35 U.S.C. § 120 of U.S. Non-Provisional application Ser. No. 13/690,904 filed on Nov. 30, 2012, which claims the benefit of priority of U.S. Provisional Application Ser. No. 61/565,024 filed on Nov. 30, 2011, the contents of which are relied upon and incorporated herein by reference in its entirety.

FIELD

This disclosure is directed to an improved process for making glass articles having an optical coating and an easy-to-clean coating formed thereon. In particular, the disclosure is directed to a process in which the application of the optical coating and the easy-to-clean coating can be sequentially applied using the same apparatus.

BACKGROUND

Glass, and in particular chemically strengthened glass, has become the material of choice for viewscreens of many, if not most, consumer electronic products. For example, chemically strengthened glass is particularly favored for "touch" screen products, including small items, such as cell phones, music players, e-book readers and electronic notepads, or larger items, such as computers, automatic teller machines, airport self-check-in machines and other similar electronic items. Many of these items may require the application of antireflective ("AR") coatings on the glass in order to reduce the reflection of visible light from the glass and thereby improve contrast and readability, particularly when the device is used in direct sunlight. However, drawbacks of the AR coating can include its sensitivity to surface contamination and poor anti-scratch reliability. Fingerprints and stains on an AR coating are very noticeable on an AR coated surface. As a result, it may be desirable that the glass surface of a touch device be easy to clean which may be achieved by applying an easy-to-clean ("ETC") coating to the glass surface.

The current processes for making glass articles having both antireflection and easy-to-clean coatings require that the coatings be applied using different equipment and, consequently, separate manufacturing runs. The basic procedure is to provide a glass article; apply the antireflection ("AR") coating using, for example, a chemical vapor ("CVD") or physical vapor deposition ("PVD") method. The optical coated (such as AR coated) articles may be transferred from the coating apparatus to another apparatus to apply the ETC coating on top of the AR coating. While these processes can produce articles that have both an AR ETC coating, they require separate runs and have higher yield losses due to the extra handling that is required. They may also result in poor reliability of the final product because of contamination arising from the extra handling between the AR coating and ETC coating procedures. Further, in a state-of-the-art 2-step coating process, applying an ETC coating over an optical coating can result in a coating that is easily scratched in touch applications where the user uses a finger to access and use an application on a device, and then uses a cloth to wipe off finger oils and moisture that create haze on the touch surface. While the AR coated surface can be cleaned before applying the ETC coating, this involves additional steps in the manufacturing process. These additional steps increase product costs. Consequently, it is highly desirable to find a process in which both coatings can be applied using the same basic procedure and equipment, thus reducing manufacturing costs.

SUMMARY

In embodiments, a process for vacuum depositing without breaking vacuum an optical coating and an easy-to-clean (ETC) coating onto a glass substrate is disclosed. The process comprises providing a coating apparatus having an optical coating chamber for deposition of at least one optical coating and an ETC coating chamber for deposition of an ETC coating, introducing a horizontally-oriented glass substrate to be coated into the optical coating chamber under a pressure of less than or equal to $10^{-4}$ Torr, the glass substrate having a first surface, a second surface opposite the first surface, and a thickness between the first surface and the second surface, depositing at least one optical coating onto the substrate, transferring the substrate to the ETC coating chamber without breaking vacuum, reorienting the substrate in the ETC coating chamber such that the substrate is vertically-oriented, depositing an ETC coating on the at least one optical coating, and removing the substrate from the coating apparatus to provide a glass article having the optical coating formed thereon and the ETC coating formed on the optical coating. In one or more embodiments, the glass article may be post-treated at a temperature from about 60° C. to about 200° C. for a period of time, for example, from about 5 minutes to about 60 minutes, in air or humid environment to facilitate cross-linking between ETC molecules. The humid environment may have a relative humidity RH between about 40% to about 100%.

In one or more embodiments, the substrate utilized may include borosilicate glass, aluminosilicate glass, soda-lime glass, chemically strengthened borosilicate glass, chemically strengthened aluminosilicate glass or chemically strengthened soda-lime glass. The substrate may have a thickness of from about 0.2 mm to about 1.5 mm. In one or more specific embodiments, the substrate is an aluminosilicate glass. The substrate may exhibit a compressive stress of greater than 400 MPa and a depth of layer greater than 14 µm.

In one or more embodiments, the optical coating may be deposited via inline sputtering. In a specific embodiment, the distance between a sputtering source and the substrate may be from about 30 mm to about 100 mm. The optical coating may include a multilayer coating comprising alternating layers of a high refractive index material H and one of low refractive index material L or medium refractive index material M. In one or more embodiments, the high refractive index material H has a refractive index greater than 1.7 and less than or equal to 3.0. The low refractive index material L may exhibit a refractive index greater than or equal to 1.3 and less than or equal to 1.6. The medium refractive index material M may exhibit a refractive index greater than 1.6 and less than or equal to 1.7. In one or more embodiments, the optical coating may be deposited or laid down in the order H(L or M) or (L or M)H, wherein each H(L or M) or (L or M)H pair of layers is a coating period. The thickness of an H layer and an (L or M) layer, independent of each other, in each coating period may be from about 5 nm to about 200 nm. In a specific embodiment, the multilayer optical coating may have from 2 to about 20 coating periods. The multilayer optical coating may have a total thickness in the range from about 10 nm to about 2000 nm. In one or more specific embodiments, the last coating period of the optical coating may include a high refractive index layer. In such embodiments, a capping layer of $SiO_2$ may be optionally applied over the high refractive index layer.

In one or more embodiments, the optical coating chamber may be divided into an even number of sub-chambers, for example, from 2 to 10 sub-chambers, and a coating period of a multilayer optical coating may be applied in an odd/even pair of sub-chambers. For example, the odd numbered sub-chambers may be used to deposit either a high refractive index material H or a low refractive index material L and the even numbered sub-chambers may be used to deposit the other of the high refractive index material H or the low refractive index material L.

The ETC coating may be deposited via chemical vapor deposition, physical vapor deposition, electron beam deposition or thermal evaporation source deposition. Exemplary ETC coating source materials may include a perfluoroalkyl silane of formula $(R_F)_y SiX_{4-y}$, where $R_F$ is a linear perfluoroalkyl having a carbon chain length of 6-130 carbon atoms from the silicon atom to an end of the chain at its greatest length, X=Cl, acetoxy, —$OCH_3$ or —$OCH_2CH_3$ and y=1 or 2; and/or a perfluoropolyether silane of formula $[CF_3—(CF_2CF_2O)_a]_y SiX_{4-y}$ where a is 5-10, y=1 or 2, and X is —Cl, acetoxy, —$OCH_3$ or —$OCH_2CH_3$, wherein a total perfluoropolyether chain length is 6-130 carbon atoms from the silicon atom to the end of the chain at its greatest length. The ETC coating may have a thickness from about 1 nm to about 20 nm.

DETAILED DESCRIPTION

Figures 1A, 1B:
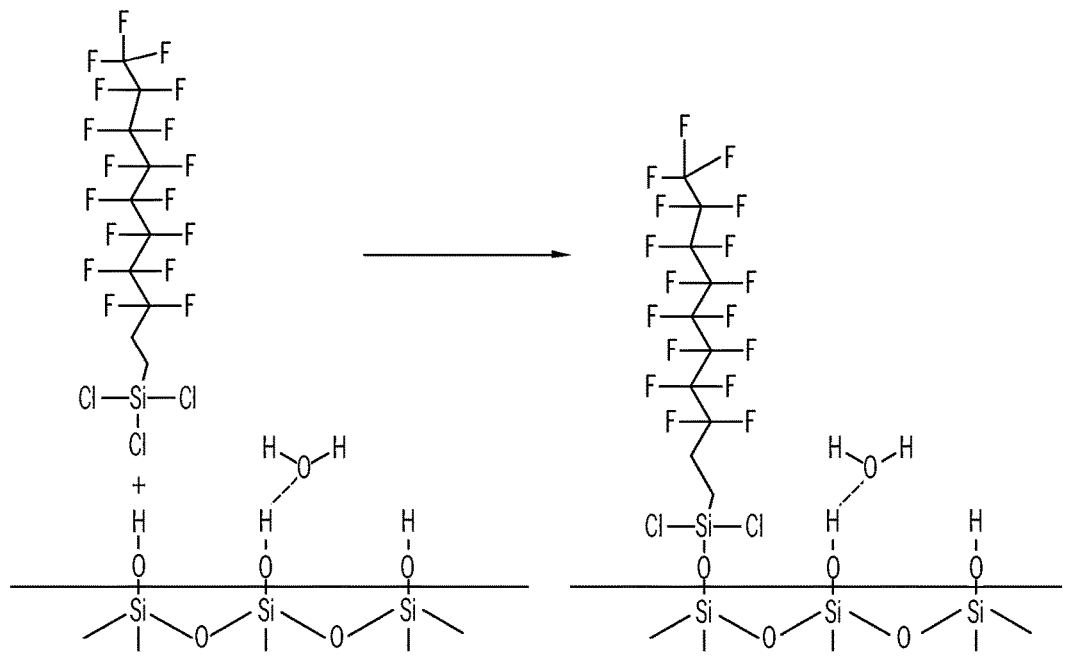
FIGS. 1a-1c schematically depict the perfluoroalkyl silane grafting reaction with glass or an oxide AR coating.

Reference will now be made in detail to embodiments of processes for making glass articles, examples of which are illustrated in the accompanying drawings. Whenever possible, the same reference numerals will be used throughout the drawings to refer to the same or like parts. Described herein are processes for making glass articles having an optical coating layer and an ETC coating layer formed thereon. The processes generally comprise providing a coating apparatus having an optical coating chamber for deposition of at least one optical coating and an ETC coating chamber for deposition of an ETC coating, introducing a glass substrate to be coated into the optical coating chamber under a pressure of less than or equal to $10^{-4}$ Torr, the glass substrate having a first surface, a second surface opposite the first surface, and a thickness between the first surface and the second surface, depositing at least one optical coating onto the substrate, transferring the substrate to the ETC coating chamber without breaking vacuum, depositing an ETC coating on the at least one optical coating, and removing the substrate from the coating apparatus to provide a glass article having the optical coating and ETC coating formed thereon. In embodiments herein, the In some embodiments, the processes may further comprise post-treating the glass article at a temperature of from about 60° C. to about 200° C. for a period of time from about 5 minutes to about 60 minutes in an air or humid environment having a relative humidity RH of 40%<RH<100% to facilitate cross-linking between ETC molecules. In some embodiments, the processes may further comprise wiping the glass article to remove excess, unbonded ETC coating source materials after post-treating the glass article. In some embodiments, after post-treating the glass article, the glass article may have an average water contact angle of at least 70° after abrasion testing, as further defined herein.

The substrate described herein may be selected from the group consisting of borosilicate glass, aluminosilicate glass, soda-lime glass, chemically strengthened borosilicate glass, chemically strengthened aluminosilicate glass, and chemically strengthened soda-lime glass. In some embodiments, substrate is selected from chemically strengthened aluminosilicate glass. In other embodiments, the substrate is selected from chemically strengthened aluminosilicate glass having a compressive stress of greater than 150 MPa and a depth of layer greater than 14 µm. In further embodiments, the substrate is selected from chemically strengthened aluminosilicate glass having a compressive stress of greater than 400 MPa and a depth of layer greater than 25 µm. The substrate may have a selected length and width, or diameter, to define its area. The substrate may have at least one edge between the surfaces of the substrate defined by its length and width, or diameter. The substrate may also have a selected thickness. In some embodiments, the substrate has a thickness of from about 0.2 mm to about 1.5 mm, from about 0.2 mm to about 1.3 mm, and from about 0.2 mm to about 1.0 mm.

The optical coating may include, for example, antireflective (AR) coatings or anti-glare coating used in ultraviolet ("UV"), visible ("VIS") and/or infrared ("IR") applications, band-pass filter coatings, edge neutral mirror and beam splitter coatings, multi-layer high-reflectance coatings, and edge filter coatings. It should be understood, however, that other optical functional coatings may be used to achieve a desired optical property of the resulting glass article (see "Thin Film Optical Filter," 3$^{rd}$ edition, H. Angus Macleod, Institute of Physics Publishing Bristol and Philadelphia, 2001). The optical coatings can be used to form glass articles that may be used as displays, camera lenses, telecommunication components, medical and scientific instruments, used in photochromic and electrochromic applications, photovoltaic devices, and as other elements and devices.

The optical coating source materials described herein may include a low refractive index material L having a refractive index from about 1.3 to about 1.6, a medium refractive index material M having a refractive index from about 1.6 to about 1.7, or a high refractive index material H having a refractive index from about 1.7 to about 3.0. As used herein, the term "index" and "refractive index" both refer to the index of refraction of the material. Examples of suitable low refractive index materials include silica, fused silica, fluorine doped fused silica, $MgF_2$, $CaF_2$, YF and $YbF_3$. Examples of suitable medium refractive index materials include $Al_2O_3$. Examples of suitable high refractive index materials include $ZrO_2$, $HfO_2$, $Ta_2O_5$, $Nb_2O_5$, $TiO_2$, $Y_2O_3$, $Si_3N_4$, $SrTiO_3$ and $WO_3$. In some embodiments, the optical coating source materials may also include transparent conductive oxide coating ("TCO") materials. Examples of suitable TCO materials may include, but are not limited to, ITO (indium tin oxide), AZO (Al doped zinc oxide), IZO (Zn stabilized indium oxides), $In_2O_3$, and other binary, ternary or quaternary oxide compounds suitable for forming a doped metal oxide coating.

The optical coating source materials may be deposited as a single layer coating or a multilayer coating. In some embodiments, a single layer coating is formed using a low refractive index material L as the optical coating source material. In other embodiments, a single layer coating is formed using a $MgF_2$ optical coating source material. The single layer coating may have a selected thickness. In some embodiments, the thickness of the single layer coating may be greater than or equal to 50 nm, 60 nm, or 70 nm. In some embodiments, the thickness of the single layer coating may be less than or equal to 2000 nm, 1500 nm, 1000 nm, 500 nm, 250 nm, 150 nm or 100 nm.

The optical coating source materials may also be deposited as a multilayer coating. In some embodiments, the multilayer coating may comprise alternating layers of a low refractive index material L, a medium refractive index material M, and a high refractive index material H. In other embodiments, the multilayer coating may comprise alternating layers of a high refractive index material H and one of (i) a low refractive index material L or (ii) a medium refractive index material M. The layers may be deposited such that the order of the layers is H(L or M) or (L or M)H. Each pair of layers, H(L or M) or (L or M)H, may form a coating period or period. The optical coating may comprise at least one coating period to provide the desired optical properties, including, for example and without limitation, antireflective properties. In some embodiments, the optical coating comprises a plurality of coating periods, wherein each coating period consisting of one high refractive index material and one of a low or medium refractive index material. The number of coating periods present in a multilayer coating may be from 1 to 1000. In some embodiments, the number of coating periods present in a multilayer coating may be from 1 to 500, from 2 to 500, from 2 to 200, from 2 to 100, or from 2 to 20.

The optical coating source materials may be selected such that the same refractive index materials are used in each coating period, in some embodiments, or the optical coating source materials may be selected such that different refractive index materials are used in each coating period, in other embodiments. For example, in an AR coating having two coating periods, the first coating period may comprise $SiO_2$ only and the second period may comprise $TiO_2/SiO_2$. The ability to vary the alternating layers and coating period may allow a complicated optical filter having the desired optical properties, and including an AR coating, to be formed.

The thickness of each layer in a coating period, i.e., the H layer and the L(or M) layer, may independently be from about 5 nm to about 200 nm, from about 5 nm to about 150 nm, or from about 25 nm to about 100 nm. The multilayer coating may have a thickness from about 100 nm to about 2000 nm, from about 150 nm to about 1500 nm, from about 200 nm to about 1250 nm, or from about 400 nm to about 1200 nm.

The processes described herein may further comprise applying a capping layer of $SiO_2$ on the last layer of the AR coating. In some embodiments, the capping layer is added when the last layer of the last AR coating period is a high refractive index layer. In other embodiments, the capping layer is added when the last layer of the last AR coating period is not $SiO_2$. In further embodiments, the capping layer may optionally be added when the last layer of the last AR coating period is $SiO_2$. In some embodiments, the capping layer may have a thickness of from about 20 nm to about 400 nm, from about 20 nm to about 300 nm, from about 20 nm to about 250 nm, or from about 20 nm to about 200 nm.

The optical coating layers can be deposited using a variety of methods including physical vapor deposition ("PVD"), electron beam deposition ("e-beam" or "EB"), ion-assisted deposition-EB ("IAD-EB"), laser ablation, vacuum arc deposition, thermal evaporation, sputtering, plasma enhanced chemical vapor deposition (PECVD) and other similar deposition techniques.

The ETC coating may provide lubrication to the surface of glass, and underlying transparent conductive coatings (TCO) and/or optical coatings. The ETC coating may be considered as a part of the optical coating during the design phase and therefore, may be engineered so that the ETC coating does not affect or change the optical performance of the optical coating.

ETC coating source materials are used to form the ETC coating. ETC coating source materials may be selected from the group consisting of fluoroalkylsilanes, perfluoroalkylsilanes, perfluoroalkyl alkyl silanes, perfluoropolyethersilanes, perfluoropolyether alkoxy silanes, perfluoroalkyl alkoxy silanes, fluoroalkylsilane (non fluoroalkylsilane) copolymers, mixtures of fluoroalkylsilanes, and mixtures thereof.

Figure 1C:
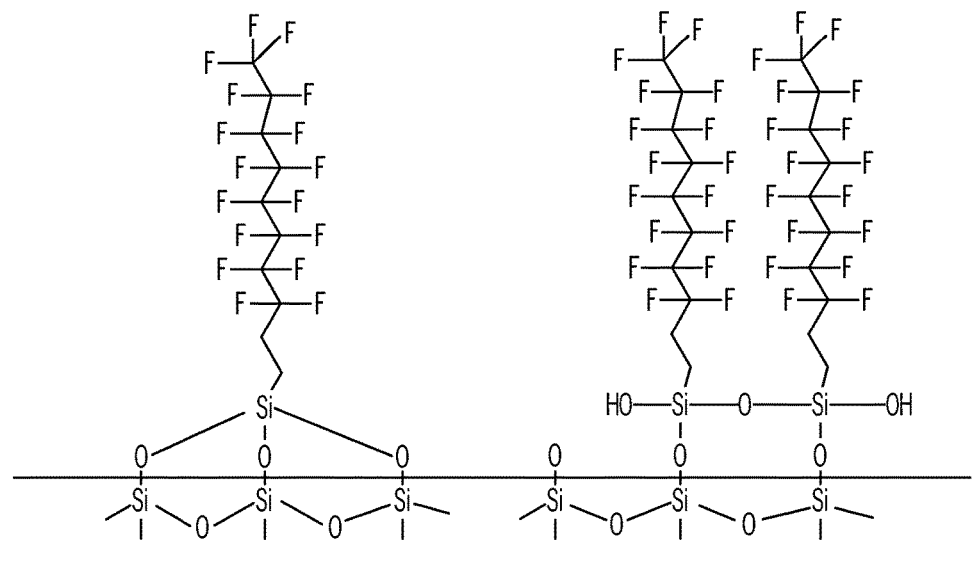

In some embodiments, the ETC coating comprises a perfluoroalkyl silane of formula $(R_F)_y$—$SiX_{4-y}$, where y=1, 2 or 3, the $R_F$ group is a perfluoroalkyl group having a carbon chain length of 6-130 carbon atoms from the silicon atom to the end of the chain at its greatest length, and X is —Cl, acetoxy, —$OCH_3$ or —$OCH_2CH_3$. The perfluoroalkyl silanes can be obtained commercially from vendors including, without limitation, Dow Corning (for example fluorocarbons 2604 and 2634), 3MCompany (for example ECC-1000 and ECC-4000), and other fluorocarbon suppliers such as Daikin Corporation, Ceko (South Korea), Cotec-GmbH (DURALON UltraTec materials) and Evonik. FIGS. 1 a-c schematically depict an exemplary silane grafting reaction with glass or an oxide AR coating using a $(R_F)_y SiX_{4-y}$ moiety. Referring to FIGS. 1a & 1b, a perfluoroalkyl-trichlorosilane is shown covalently bound to a surface of a silica glass substrate to form a silane coating on the substrate. FIG. 1c illustrates that when a perfluoroalkyl-trichlorosilane is grafted to the surface of a glass substrate or to the surface of a multilayer oxide coating, the silane silicon atom can be either (1) triply covalently bonded (three Si—O bonds) to the surface of the glass substrate or the surface of the multilayer oxide coating on the substrate or (2) covalently bonded to a glass substrate or the surface of the multilayer oxide coating on the substrate such that two $R_F$-Si moieties each having one Si—O—Si bond are adjacent. In some embodiments, the ETC coating source materials may include a perfluoroalkyl silane of formula $(R_F)_y SiX_{4-y}$, where $R_f$ is a linear $C_6$-$C_{30}$ perfluoroalkyl group, X=Cl or —$OCH_3$, and y=2 or 3.

In other embodiments, the ETC coating comprises a perfluoropolyether silane of formula [$CF_3$—$(CF_2CF_2CF_2O)_a]_y SiX_{4-y}$ where a is 5-10, y=1 or 2, and X is —Cl, acetoxy, —$OCH_3$ or —$OCH_2CH_3$, wherein the total perfluoropolyether chain length is 6-130 carbon atoms from the silicon atom to the end of the chain at its greatest length. In further embodiments, the ETC coating comprises a perfluoroalkyl alkyl silane of formula [$R_F$—$(CH_2)_b]_y SiX_{4-y}$, where $R_F$ is a perfluoroalkyl group having a carbon chain length of 10-16 carbon atoms, —$(CH_2)_b$— is an alkyl group and b is 14-20, y=2 or 3, and X is —Cl, acetoxy, —$OCH_3$ or $OCH_2CH_3$. As used herein, the length of the carbon chain in nanometers ("nm") is the product of the number of carbon-carbon bonds along the greatest length of the chain multiplied by the carbon-carbon single bond length of 0.154 nm. In some embodiments, the carbon chain length of the perfluoropolyether group, perfluoroalkyl group, or perfluoroalkyl-alkyl group can range from about 0.1 nm to about 50 nm, from about 0.5 nm to about 25 nm, or from about 1 nm to about 20 nm. In some embodiments, the carbon chain length of the perfluoroalkyl group is from about 3 nm to about 50 nm.

The ETC coating thickness may vary and can be applied such that it has a thickness sufficient to cover the entire optical coating surface, provide for dense coverage of the ETC coating, and/or ensure better reliability. In some embodiments, the ETC coating may have a thickness of from about 0.5 nm to about 50 nm, from about 1 nm to about 25 nm, from about 4 nm to about 25 nm, or from about 5 nm to about 20 nm. In other embodiments, the ETC coating may have a thickness of from about 10 nm to about 50 nm, The ETC coating material can be deposited on top of the optical coating by thermal evaporation, chemical vapor deposition (CVD) or atomic layer deposition (ALD).

In one embodiment, the present disclosure is directed to a process in which, in a first step, a multilayer optical coating is deposited on a glass substrate followed by a second step in which an ETC coating is thermally evaporated and deposited on the multilayer optical coating. In this embodiment, the first and second steps are carried out in the same chamber. In another embodiment, a multilayer optical coating is deposited on a glass substrate in one chamber followed by the thermal evaporation and deposition of the ETC coating on top of the multilayer coating in a second chamber, with the provision that the transfer of the multilayer coated substrate from the first chamber to the second chamber is carried out sequentially, inline in a manner such the substrate is not exposed to air or ambient atmosphere between the application of the multilayer optical coating and the ETC coating. In some embodiments, the application of the optical coating and the ETC coating are carried out in separate chambers, the first chamber and second chamber may be connected by a vacuum lock so that the substrate being coated can be moved from one chamber to the other without exposure to air or ambient atmosphere; the load/unload chambers on the substrate in/out sides of the coating system are connected to the coating chambers by a vacuum lock on the connection side and by a lock that opens to the other side. In this manner, the uncoated substrate can be loaded and/or unloaded while vacuum is maintained in the coating chambers. Regarding the deposition of the optical coating, variations in the manner of its deposition can be used. For example, in one variation, separate coating chambers may be used for each optical coating material being coated onto the substrate. This variation requires a greater number of chambers depending on the number of coating periods utilized for the optical coating, particularly for a multi-period coating. This variation may be utilized when coating very large substrates, for example, those larger than 0.4 meter in one dimension. In another variation, in a multi-period coating in which each period consists of a high refractive index material H and a low refractive index material L, each period may be applied in a separate chamber. This can allow for the number of chambers utilized for coating to be minimized when a multi-period optical coating is being applied to the substrate and also allows for the substrate to progress through the system more rapidly. In another embodiment all coatings are applied to the substrate in a single chamber. The processes can be applied to PVD, CVD/PECVD, and ALD coating systems. Depending on the size of the chamber or chambers and the size of the substrates being coated, one or a plurality of substrates can simultaneously be coated within a chamber.

The ETC coating process can be the last deposition step and can be performed in the optical coating chamber, as a separate process without breaking vacuum in a sequential chamber after the optical coating has been applied in an inline system, or in a sequential chamber with a break in vacuum directly after the optical coating has been applied. The ETC coating process time can be short and may provide a cured coating having a thickness in the range of from about 1 nm to about 20 nm of ETC (for e.g., perfluoroalkyl silane) coating material on the optical coating without breaking vacuum.

The ETC coating method may comprise applying an ETC coating on top of an optical coating. The ETC coating may be cured to bond the ETC coating to the optical coating, forming a Si—O covalent bond between the optical coating and ETC coating. The ETC coating material can be obtained from commercial sources such as those listed above.

After naturally curing, which as used herein refers to curing at room temperature (approximately about 18° C. to about 30° C.), or curing at elevated temperatures, as specified herein, in air, one mono layer may be chemically bonded to the optical coating. Excess, unbonded ETC coating source materials can be can be removed to improve the optical clarity, for example by wiping. The final thickness of the ETC coating chemically bonded to the optical coating may be from about 1 nm to about 20 nm, depending on the molecular weight of the ETC coating source materials. The relative humidity for natural curing may be at least 40%. While the natural curing method is inexpensive, it can require 3-6 days for adequate curing to occur. Consequently, it may be desirable to cure the ETC coating at a temperature above 50° C. For example, curing can be carried out at a temperature of from about 60° C. to about 200° C. for a period of time of from about 5 minutes to about 60 minutes in an air or humid environment having a relative humidity RH of 40%<RH<100%. In some embodiments, the air or humid environment have a relative humidity of 40%<RH<100. In other embodiments, the air or humid environment have a relative humidity of 60%<RH<95.

In embodiments, described herein is a process in which both an optical coating, for example, an AR coating, and an ETC coating can be applied to a glass substrate article in sequential steps of the optical coating first and the ETC coating second, using substantially the same procedure without exposing the article to the atmosphere at any time during the application of the optical coating and the ETC coating. In embodiments described herein, the abrasion resistance of the glass and optical coatings can be improved by more than 10 times as compared to ETC coatings that are applied with conventional 2-step coating process. In embodiments described herein, the abrasion resistance of the glass and optical coatings can be improved by more than 100-1000 times as compared to AR coatings without ETC coatings formed by in-situ one-step processes.

In embodiments, described herein is an in-situ coating process of a plasma enhanced chemical vapor deposition (PECVD) method. In the process, the AR coating may be deposited on a substrate using precursors that are decomposed by plasma to form an AR coating. Examples of some precursors that may be used include, for example $SiH_4$, $NH_3$, $N_2O$, $O_2$, trimethyl aluminum, titanium ethoxide, titanium tetrachloride, tetraethoxysilane (TEOS), titanium isopropoxide (TIPT), and tetramethylammonium (TMA). In some embodiments, for example and without limitation, a "$SiO_2/TiO_2/SiO_2/TiO_2$/substrate" article where the substrate may be sequentially coated with tetraethoxysilane (TEOS) precursor for $SiO_2$ and titanium isopropoxide (TIPT) precursor for $TiO_2$ in the order indicated, the $SiO_2$ layer being the last layer. (*Deposition of $SiO_2$ and $TiO_2$ thin films by plasma enhanced chemical vapor deposition for antireflection coating*, C. Martinet, V. Paillard, A. Gagnaire, J. Joseph, Journal of Non-Crystalline Solids, Volume 216, 1 Aug. 1997, Pages 77-82). An ETC coating may be applied on top of an $SiO_2$ cap layer of the AR coating, for example, using Dow-Corning DC2634 and Daikin DSX with solvent as precursor after finishing the AR coating.

In embodiments described herein, the PVD coating techniques (sputtered or IAD-EB coated AR coating with thermal evaporation of ETC coating) are a "cold" process where the substrate temperature is less than or equal to 100° C. In such processes, there may be no degradation of the strength of the chemically tempered glass substrate to which the coatings are applied. The term "IAD" mean "ion-assisted deposition" meaning ions from an ion source are used to bombard the coating as it is being deposited. The ions can also be used to clean the substrate surface prior to coating.

In embodiments, a process for making glass articles having an optical coating on the glass articles and an ETC coating on top of the optical coating is described herein. The process comprises providing a coating apparatus having at least one chamber for the deposition of an optical coating and ETC coating, providing within said at least one chamber at least one source material(s) for the optical coating and a source material for the ETC coating, wherein when a plurality of source materials are required for making the optical coating, each of the plurality of materials is provided in a separate source material container, providing a substrate to be coated, the substrate having a length, a width and a thickness and at least one edge between the surfaces of the glass defined by the length and width (or diameter(s) for circular or oval substrates), evacuating the chamber to a pressure of $10^{-4}$ Torr or less, depositing the at least one optical coating material on the substrate to form an optical coating, ceasing the deposition of the optical coating, following the deposition of the optical coating, depositing the ETC coating on top of the optical coating, ceasing the deposition of the ETC coating, and removing the substrate having an optical coating and an ETC coating from the chamber to thereby provide a glass article having optical coating and an ETC coating, and post-treating the article at a temperature in the range of 60-200° C. for a time in the range of 5-60 minutes in air or humid environment with relative humidity RH in the range of 40%<RH<100% to create strong chemical bonding between the ETC coating and the substrate and crossing between ETC molecules.

In embodiments described herein, an optical coating may be deposited onto a substrate in a first chamber to form an optical coating and an ETC coating may be deposited on top of the optical coating in a second chamber. The two chambers may be connected by a vacuum seal/isolation-lock for transferring the substrate with the optical coating formed thereon from the first chamber to the second chamber without exposing the substrate/coating to the atmosphere. In embodiments described herein the first chamber may be divided into an even number of optical coating sub-chambers. The number of sub-chambers may be from 2-10, 2-8, or 2-6. The odd numbered sub-chambers may be used to deposit either of the high refractive index material or the low refractive index material and the even numbered sub-chambers may be used to deposit the other of the high refractive index material or the low refractive index material.

In embodiments, described herein is a glass article having an optical coating on a glass substrate and an ETC coating on top of the optical coating. The glass may have a length, a width and at least one edge between the surfaces of the glass defined by the length and width (or diameter). The optical coating may be a multilayer coating comprising a plurality of periods H (L or M) or (L or M)H, wherein H is a high refractive index material having a refractive index greater than 1.7 and less than or equal to 3.0, L is a low refractive index material having a refractive index greater than or equal to 1.3 and less than or equal to 1.6, and M is a medium refractive index material having a refractive index greater than 1.6 and less than or equal to 1.7. An ETC coating is formed on top of the optical coating, wherein the ETC coating has the formula $(R_F)_y SiX_{4-y}$, where $R_F$ is a linear $C_6$-$C_{30}$ perfluoroalkyl group, X=Cl or —OCH$_3$, and y=2 or 3. In embodiments, the perfluoroalkyl $R_F$ may have a carbon chain length of from about 3 nm to about 50 nm.

In embodiments described herein, the ETC coating may be deposited on top of an SiO$_2$ layer. In embodiments described herein, when the last layer of the last period of the optical coating is not SiO$_2$, a SiO$_2$ capping layer may be deposited on top of the last layer of the last coating period and an ETC coating may be deposited on top of the SiO$_2$ capping layer.

In embodiments described herein, the optical coating density may be an important aspect of the reliability of the coating and its abrasion resistance. As a result, in embodiments described herein, the optical coating may be densified during the coating process by use of an ion or plasma source. The ions or plasma may impact the coating during deposition and/or after a coating layer has been applied to densify the layer. A densified layer may have at least double the abrasion reliability and/or abrasion resistance as compared to a layer that is not densified.

Figure 3:
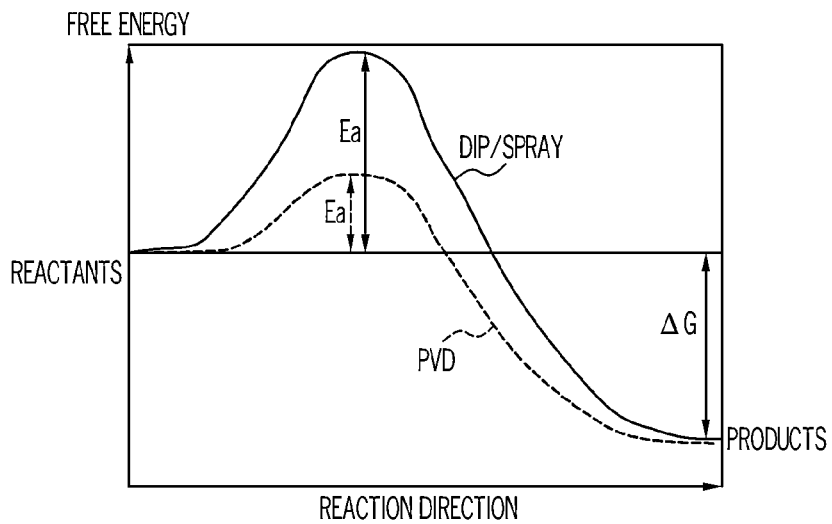
FIG. 3 graphically depicts that the AR optical coating layers that underlie the ETC coating provide a barrier to isolate the glass surface chemistry and prevent contamination and also provide a lower activation energy site for perfluoroalkyl silanes to chemically bond to the AR optical coating with maximum coating density as well as cross linking over the coated surface to providing enhanced abrasion reliability.

In embodiments, a physical vapor deposition (PVD) process is described herein. In the PVD process, a small amount of condensed ETC material may be thermally evaporated from a boat or crucible and a thin 10-50 nm, uniform ETC coating may be condensed on the freshly prepared top of the optical coating on the substrate. An SiO$_2$ layer may be the final layer of the optical coating or may be applied as a cap layer for the optical coating. The SiO$_2$ layer may provide the highest surface density and may also provide for crosslinking of fluorinated groups from the ETC coating because the optical coating and SiO$_2$ layers were deposited at high vacuum (e.g., from $10^{-4}$ Torr to about $10^{-6}$ Torr) without the presence of free OH radicals. Free OH radicals, for example, can form a thin layer of water on the glass or AR surface, which can be detrimental because it may prevent the fluorinated groups of the ETC coating from bonding with metal oxides or silicon oxide surfaces. When the vacuum in the deposition apparatus is broken, that is, where the apparatus is opened to the atmosphere, air from the environment containing water vapor may be admitted and the perfluoroalkyl silane moiety present on the SiO$_2$ or the top of the AR optical coating layer, whether it is SiO$_2$ or other metal oxide, may react with the moisture and the coating surface to create a chemical bond with Si+4 on a SiO$_2$ cap layer final optical layer surface, or other metal oxide layer, and release alcohol or acid once exposed to air. The PVD deposited surface may be pristine and has a reactive surface. For example, in a PVD deposited ETC layer, the binding reaction has a much lower activation energy as is illustrated in FIG. 3 than a dip/spray coating method. FIG. 3 depicts a comparison of the activation energy for an ETC coating deposited on an AR optical coating using (1) vapor deposition of the ETC without exposure of the optical coating to the atmosphere versus (2) the prior art method of ETC spray or dip coating in a separate step outside of the AR coating chamber in which the AR coating is exposed to the atmosphere. ETC coating in vacuum can provide a lower activation energy site for perfluoroalkyl silanes to chemically bond to the AR optical coating with maximum coating density as well as cross linking over coated surface, which can result in a barrier. The barrier can work to isolate the glass surface chemistry from contamination and to provide abrasion reliability (durability).

In embodiments described herein, an inline sputter system is disclosed. In an inline sputter system, the number of coating layers may be limited and controlled by the number of targets in the linear motion direction. The system may be suitable for use in mass production of a fixed optical coating design, for example without limitation, a 2, 4 or 6 layer AR coating. The ETC material can be coated on top of the AR coating by either thermal evaporation or CVD. In embodiments, the ETC coating may be provided in a steel wool-filled crucible or a porous ceramic-filled copper crucible. The use of steel wool can provide for uniform heating of the ETC material and increases the evaporation surface area. The use of steel wool can also provide for a more controlled deposition rate of the ETC coating on a substrate. Using the CVD method the ETC can be deposited on both sides of the substrate. However, it should be understood that only the optical coating side may be coated with the ETC coating.

The inline sputter system sputters a sputtering source onto the substrate to produce a film of source material on at least a first surface of a substrate. Each coating layer may use a different sputtering source, and in some embodiments, multiple sputtering sources may be used to form a single coating layer. Thickness control of each layer can depend upon the distance between the sputtering source and the substrate, sputtering rate (defined as the number of sputtered particles emitted from the sputtering source), the sputtering source material, type of sputter power, sputter power intensity, type of carrier gas that may or may not be used, and the carrier gas flow rate, if used. In some embodiments, the distance between the sputtering source and the substrate is from about 10 mm to about 150 mm, from about 20 mm to about 125 mm, or from about 30 mm to about 100 mm.

In embodiments described herein, an ion-assisted electron-beam deposition can also be used and provides a unique advantage for coating small and medium size glass substrates, for example those having facial dimensions in the range of approximately 40 mm×60 mm to approximately 180 mm×320 mm depending on chamber size. In some embodiments, ion-assisted electron-beam deposition may include the benefit of: (i) having a freshly deposited AR optical coating on the glass surface that has a low surface activation energy with regard to the applying an ETC coating since there is no surface contamination (water or other environmental) that might impact to ETC coating adhesion, performance and reliability. The application of the ETC coating directly after completion of the optical coating improves crosslinking between fluorocarbon functional groups, improves wear resistance, and improves contact angle performance (higher oleophobic and oleophobic contact angles) after thousands of wipes; (ii) greatly reducing coating cycle time to enhance coater utilization and throughput; (iii) eliminating the requirement of post heat treatments or UV curing due to lower activation energy of the optical coating surface which can make the process compatible with post ETC processes in which heating is not allowed; and (iv) only coating the ETC coating source materials on unselected regions, using the PVD process, to avoid contamination to other locations of substrate. The methods and glass articles will be described in further detail herein with specific reference to the appended drawings.

Figure 2:
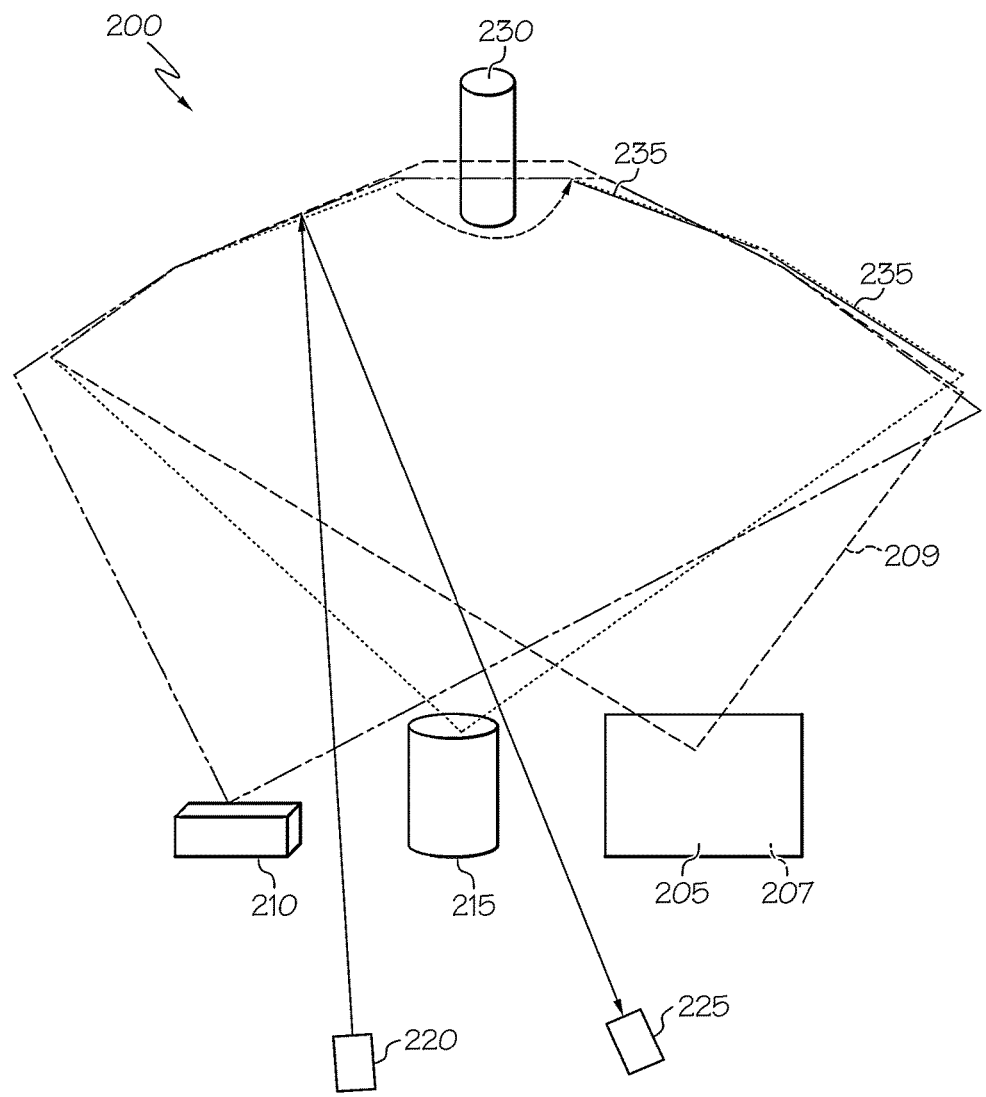
FIG. 2 schematically depicts the interior chamber of an ion-assisted electron beam deposition apparatus containing both an e-beam evaporation source 205 for deposition of the antireflection coating and a thermal evaporation source 210 for deposition of the ETC coating.

Referring to FIG. 2, the interior chamber of an ion-assisted electron beam ("e-beam") deposition apparatus 200 is depicted. The apparatus 200 coating chamber contains an e-beam evaporation source 205 for deposition of an optical coating, a thermal evaporation source 210 for deposition of the ETC coating, an ion beam source 215, a reflective in situ optical monitor that includes a light source 220 and a detector 225, a quartz and in situ optical monitor 230, a substrate carrier (not shown), and substrate 235. In operation, a substrate 235 is provided to be coated. The substrate 235 may be positioned in the chamber onto a rotating substrate carrier. The direction of rotation of the substrate holder may occur in the direction of the arrow. Of course, it should be understood that the direction of rotation of the substrate carrier may occur in the opposite direction of the arrow as well. Optionally, the chamber may be under a vacuum. Coating source materials are evaporated using either or both the thermal evaporation source 210 or the e-beam evaporation source 205. The e-beam evaporation source 205 contains optical coating source materials 207 that are deposited onto the substrate 235. The area of coverage 209 for the e-beam evaporation source 205 is shown. The thermal evaporation source 210 contains ETC coating source materials that are deposited onto the surface of the AR coating. The ion beam source 215 emits an ion beam that bombards the substrate 235 with ions simultaneously with the evaporation of the source materials onto the substrate or onto the AR coating. The light source 220 and detector 225 are used to detect the properties of the coating layers, including, for example, the coating layer thickness, and surface characteristics. In some embodiments, the optical coating source materials are deposited onto the substrate 235 to form an optical coating layer and the ETC coating materials are deposited onto the optical coating layer to form an ETC coating. The substrate 235 may then be removed from the chamber of apparatus 200.

Figure 4:
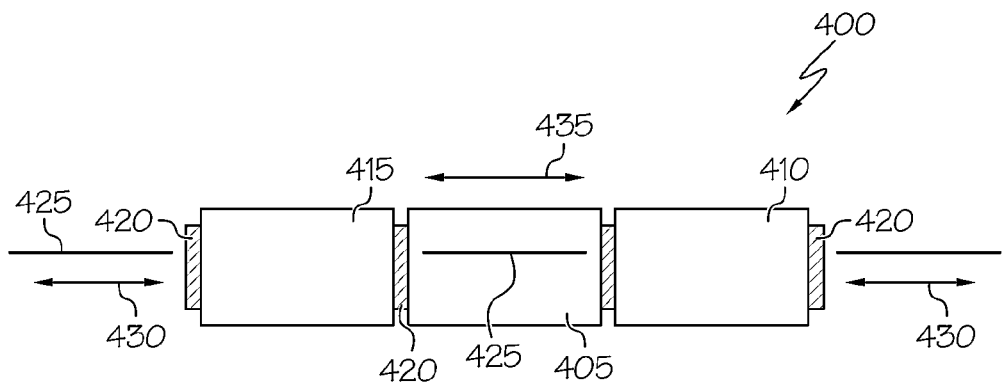
FIG. 4 schematically depicts an inline PVD coating system having a single process chamber 405 for depositing both AR and ETC coatings, a substrate carrier 425, and load-lock chambers 410, 415 on either side of a PVD process chamber 425 for loading or unloading of uncoated articles, vacuum seals or isolation valves 420, substrate moving direction 435, and the loading/unloading at 430 of articles to be coated or that have been coated.

Referring to FIG. 4, an inline physical vapor deposition (PVD) coating system 400 is depicted. The coating system 400 comprises a single process chamber 405 and load lock chambers 410, 415. The single process chamber 405 may be used to deposit both the optical coating and the ETC coating. The load lock chambers 410, 415 are positioned on either side of the process chamber 405. The load lock chambers 410, 415 may be configured to process one or more substrates, including loading and unloading of one or more substrates into and from the process chamber 405. Vacuum seals or isolation valves 420 are located on both sides of each of chambers 405, 410, and 415. The vacuum seals or isolation valves 420 may allow the substrates to be loaded into or unloaded from the process chamber while maintaining a vacuum in the process chamber 405.

In operation, a substrate is provided to be coated. The substrate is introduced into the coating system 400 to load lock chamber 415. The pressure is lowered in the load lock chamber 415 to create a vacuum. The substrate is transported to the process chamber 405 under vacuum using a substrate carrier 425. Substrate carriers 425 may be used to hold the substrate and transport it through the chambers 405, 410, and 415. The chambers 405, 410, and 415 may be evacuated to a pressure of less than or equal to $10^{-4}$ Torr. Optical source materials are deposited onto the substrate to form an optical coating in the process chamber 405. After deposition of the optical coating, ETC coating source materials are deposited onto the optical coating to form an ETC coating in the process chamber 405. It should be understood herein that deposition may also be performed by chemical vapor deposition, plasma enhanced chemical vapor deposition, physical vapor deposition, laser ablation, vacuum arc deposition, thermal evaporation, sputtering, ion-assisted electron beam deposition, or atomic layer deposition as described herein. The coated substrate is then removed from the process chamber 405 using the substrate carrier 425 to load lock chamber 415 where the pressure is raised to atmospheric pressure. The coated substrate is then transferred for further processing. The substrate may be loaded or unloaded from either side of chambers 410, 415 (as shown by the arrows 430). In addition, the substrate may be processed in either direction (as shown by the arrow 435).

The inline PVD coating system may allow enhanced throughput of substrate. Two ring-type large deposition sources and a continuous feeding thermal evaporation source can be used for up to 10-20 runs without breaking vacuum. Thermal evaporation of the ETC material can be easily combined with other PVD processes in the same chamber, or it can be carried out in another adjacent chamber if the optical coating chamber does not permit the use of the ETC coating material for any reason, for example, to avoid ETC material vapor contamination of the chamber.

Figure 5:
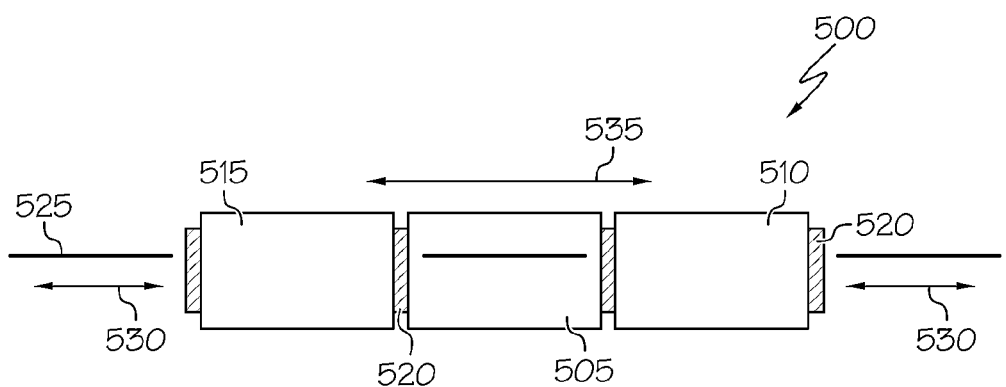
FIG. 5 schematically depicts an inline coating system having a separate PVD coating chamber 505 and a separate ETC coating chamber 510, load-lock chamber 515 with vacuum seals 520, and substrate carriers 525, with the process direction indicated by the arrows 530 and 535.

Referring to FIG. 5, an inline coating system 500 is depicted. The system 500 comprises a PVD coating chamber 505, a ETC coating chamber 510, and a load lock chamber 515. The PVD coating chamber 505 may be used to deposit optical coating source materials onto the substrate to form an optical coating. The ETC coating chamber may be used to deposit ETC coating source materials onto the optical coating to form an ETC coating. The load lock chamber 515 may be configured to process one or more substrates, including loading and unloading of one or more substrates into and from the PVD coating chamber 505. Vacuum seals or isolation valves 520 are located on both sides of each of chambers 505, 510 and 515. The vacuum seals or isolation valves 520 may allow the substrates to be loaded into or unloaded from the PVD coating chamber 505 and the ETC coating chamber 510, while maintaining a vacuum in the chambers 505, 510.

In operation, a substrate is provided to be coated. The substrate is introduced into the coating system 500 to load lock chamber 515. The pressure is lowered in the load lock chamber 515 to create a vacuum. The substrate is transported to PVD coating chamber 505 under vacuum using a substrate carrier 525. Substrate carriers 525 may be used to hold the substrate and transport it through the chambers 505, 510, and 515. The chambers 505, 510, and 515 may be evacuated to a pressure of less than or equal to $10^{-4}$ Torr. Optical source materials are deposited onto the substrate to form an optical coating in the PVD coating chamber 505. After deposition of the optical coating, the substrate is transported to ETC coating chamber 510 under vacuum using a substrate carrier 525. ETC coating source materials are deposited onto the optical coating to form an ETC coating in the ETC coating chamber 510. The coated substrate may be then removed from the ETC coating chamber 510 using the substrate carrier 525 for further processing. In some embodiments, the coated substrate is then removed from the ETC coating chamber 510 using the substrate carrier 525 back to load lock chamber 515 where the pressure is raised to atmospheric pressure. The coated substrate is then transferred for further processing. The substrate may be loaded or unloaded (as shown by the arrows 530) from either side of chambers 510, 515 depending upon the set up of the various chambers. In addition, the substrate may be processed in either direction (as shown by the arrow 535).

In the context of depositing multilayer coatings, the PVD coating chamber 505 may also be divided into an even number of sub-chambers of from 2 to 10. The coating period of the multilayer optical coating is then applied in an odd/even pair of sub-chambers. The odd numbered sub-chambers can be used to deposit either the high refractive index material H or the low refractive index material L and the even numbered sub-chambers can be used to deposit the other of the high refractive index material H or the low refractive index material L.

Figure 6:
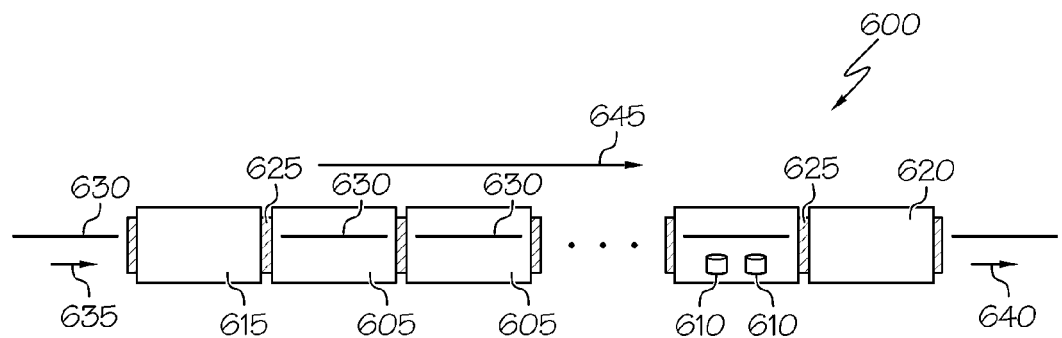
FIG. 6 schematically depicts an inline sputter coater combining optical coating using a plurality of sputter chambers 605 with ETC coating in chamber 610 on one deposition path 645, the coater also having substrate carriers 630 that load at 635 and unload at 640. The ETC process can be evaporation or chemical vapor deposition (CVD). In the CVD process, fluorinated material is carried by inert gas, for example argon. CVD is more suitable for continuous supply of perfluoroalkyl silane material through a valve control for each piece of glass. In the evaporation process, the continuous material supply and uniformity control is a challenge.

Referring to FIG. 6, an inline sputtering coating system 600 is depicted. The system 600 comprises a plurality of sputter chambers 605, an ETC coating chamber 610, and load lock chambers 615, 620. The plurality of sputter chambers 605 may be used to deposit a plurality of optical coating source materials onto the substrate to form a multilayer optical coating. Each of the plurality of optical coating source materials used to form the multilayer optical coating is provided in a separate sputter chamber 605. The ETC coating chamber 610 may be used to deposit ETC coating source materials onto the multilayer optical coating to form an ETC coating. The load lock chambers 615, 620 may be configured to process one or more substrates, including loading and unloading of one or more substrates into and from the plurality of sputter chambers 605 and the ETC coating chamber 610, while maintaining a vacuum. Vacuum seals or isolation valves 625 are located on both sides of each of chambers 605, 610, 615 and 620. The vacuum seals or isolation valves 625 may allow the substrates to be loaded into or unloaded from the plurality of sputter chambers 605 and the ETC coating chamber 610, while maintaining a vacuum.

In operation, a substrate is provided to be coated. The substrate is introduced into the coating system 600 to load lock chamber 615. The pressure is lowered in the load lock chamber 615 to create a vacuum. The substrate is transported to the first of a plurality of sputter chambers 605 under vacuum using a substrate carrier 625. Substrate carriers 630 may be used to hold the substrate and transport it through the chambers 605, 610, 615, and 620. The substrate enters the first of a plurality of sputter chambers 605 where a first optical coating source material is deposited. The substrate is transported from the first of a plurality of sputter chambers 605 to the second of a plurality of sputter chamber 605 under vacuum. The substrate enters the second of a plurality of sputter chambers 605 where a second optical coating source material is deposited. The substrate may continue on through the plurality of sputter chambers 605 for the deposition under vacuum of multiple layers of optical coating source materials to form a multilayer optical coating. The substrate is then transported to the ETC coating chamber 610 under vacuum where ETC coating source materials are deposited onto the multilayer optical coating to form an ETC coating. The coated substrate may be then removed from the ETC coating chamber 610 using the substrate carriers 630 to load lock chamber 620 where the pressure is raised to atmospheric pressure. The coated substrate is then transferred for further processing. The substrate may be loaded (as shown by the arrow 635) and unloaded (as shown by the arrow 640) in one direction. In addition, the substrate may be processed in one direction (as shown by the arrow 645).

Figure 7:
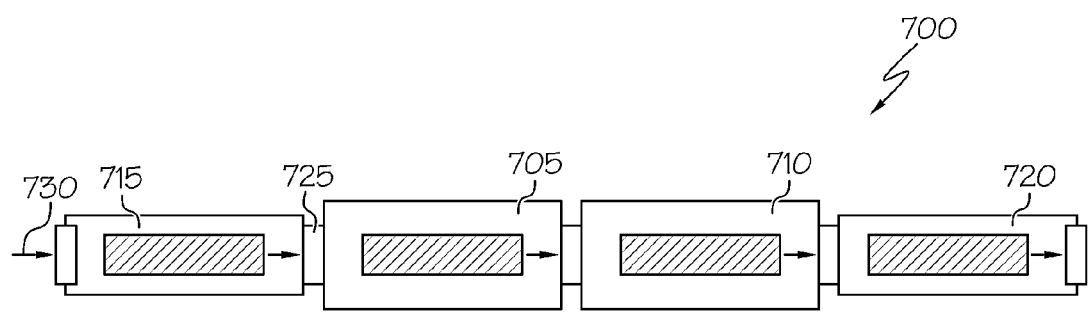
FIG. 7 schematically depicts an inline system having a CVD/PECVD coating chamber 705 for multilayer optical coating, an ETC coating chamber 710 using either CVD or thermal evaporation, load/lock chambers 715, 720, vacuum/isolation seals 725, and arrows 730 indicating the direction of the process flow.

Referring to FIG. 7, an inline CVD/PECVD coating system 700 is depicted. The system 700 comprises a CVD/PECVD chamber 705, an ETC coating chamber 710, and load lock chambers 715, 720. The CVD/PECVD chamber 705 may be used to deposit a plurality of optical coating source materials onto the substrate to form a multilayer optical coating. Each of the plurality of optical coating source materials used to form the multilayer optical coating is provided in a separate source material container (not pictured). The ETC coating chamber 710 may be used to deposit ETC coating source materials onto the multilayer optical coating to form an ETC coating. The load lock chambers 715, 720 may be configured to process one or more substrates, including loading and unloading of one or more substrates into and from the CVD/PECVD chamber 705 and the ETC coating chamber 710, while maintaining a vacuum. Vacuum seals or isolation valves 725 are located on both sides of each of chambers 705, 710, 715 and 720. The vacuum seals or isolation valves 725 may allow the substrates to be loaded into or unloaded from the CVD/PECVD chamber 705 and the ETC coating chamber 710, while maintaining a vacuum.

In operation, a substrate is provided to be coated. The substrate is introduced into the coating system 700 to load lock chamber 715. The pressure is lowered in the load lock chamber 715 to create a vacuum. The substrate is transported to the CVD/PECVD chamber 705 under vacuum using a substrate carrier. Substrate carriers may be used to hold the substrate and transport it through the chambers 705, 710, 715 and 720. The chambers 705, 710, 715 and 720 may be evacuated to a pressure of less than or equal to $10^{-4}$ Torr. Optical source materials are deposited onto the substrate to form an optical coating in the CVD/PECVD chamber 705. The substrate is transported from the CVD/PECVD chamber 705 to the ETC coating chamber 710 under vacuum. After deposition of the optical coating, ETC coating source materials are deposited onto the optical coating to form an ETC coating in the ETC coating chamber 710. The coated substrate may be then removed from the ETC coating chamber 710 using the substrate carriers to load lock chamber 720 where the pressure is raised to atmospheric pressure. The coated substrate is then transferred for further processing. The substrate may be loaded and processed in one direction (as shown by the arrow 730).

In the context of depositing multilayer coatings, the CVD/PECVD chamber 705 may also be divided into an even number of sub-chambers of from 2 to 10. The coating period of the multilayer optical coating is then applied in an odd/even pair of sub-chambers. The odd numbered sub-chambers can be used to deposit either the high refractive index material H or the low refractive index material L and the even numbered sub-chambers can be used to deposit the other of the high refractive index material H or the low refractive index material L. The system 700 may also comprise a plurality of CVD/PECVD chambers 705 to deposit a plurality of optical coating source materials onto the substrate to form a multilayer optical coating. Each of the plurality of optical coating source materials used to form the multilayer optical coating is provided in a separate CVD/PECVD chamber 705.

Figure 8:
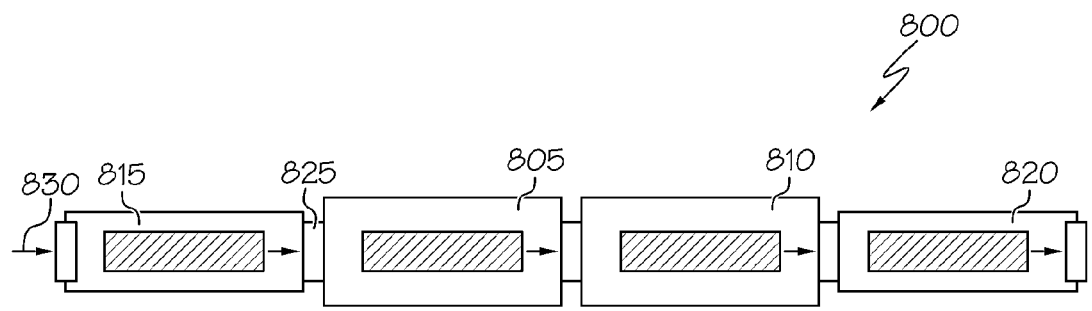
FIG. 8 schematically depicts an inline system using ALD in chamber 805 for the formation of a multilayer optical coating and an ETC coating in chamber 810, load/lock chambers 815, 820, vacuum/isolation seals 825, and arrows 830 indicating the direction of the process flow. The system is capable of placing the optical coating and the ETC coating on both sides of the substrate.

Referring to FIG. 8, an inline atomic layer deposition coating system 800 is depicted. The system 800 comprises an ALD optical coating chamber 805, an ETC coating chamber 810, and load lock chambers 815, 820. The ALD optical coating chamber 805 may be used to deposit a plurality of optical coating source materials onto the substrate to form a multilayer optical coating. Each of the plurality of optical coating source materials used to form the multilayer optical coating is provided in a separate source material container (not pictured). The ETC coating chamber 810 may be used to deposit ETC coating source materials onto the multilayer optical coating to form an ETC coating. The load lock chambers 815, 820 may be configured to process one or more substrates, including loading and unloading of one or more substrates into and from the ALD optical coating chamber 805 and the ETC coating chamber 810, while maintaining a vacuum. Vacuum seals or isolation valves 825 are located on both sides of each of chambers 805, 810, 815 and 820. The vacuum seals or isolation valves 825 may allow the substrates to be loaded into or unloaded from the ALD optical coating chamber 805 and the ETC coating chamber 810, while maintaining a vacuum.

In operation, a substrate is provided to be coated. The substrate is introduced into the coating system 800 to load lock chamber 815. The pressure is lowered in the load lock chamber 815 to create a vacuum. The substrate is transported to the ALD optical coating chamber 805 under vacuum using a substrate carrier. Substrate carriers may be used to hold the substrate and transport it through the chambers 805, 810, 815 and 820. The chambers 805, 810, 815 and 820 may be evacuated to a pressure of less than or equal to $10^{-4}$ Torr. Optical source materials are deposited onto the substrate to form an optical coating in the ALD optical coating chamber 805. The substrate is transported from the ALD optical coating chamber 805 to the ETC coating chamber 810 under vacuum. After deposition of the optical coating, ETC coating source materials are deposited onto the optical coating to form an ETC coating in the ETC coating chamber 810. The coated substrate may be then removed from the ETC coating chamber 810 using the substrate carriers to load lock chamber 820 where the pressure is raised to atmospheric pressure. The coated substrate is then transferred for further processing. The substrate may be loaded and processed in one direction (as shown by the arrow 830).

In the context of depositing multilayer coatings, the ALD optical coating chamber 805 may also be divided into an even number of sub-chambers of from 2 to 10. The coating period of the multilayer optical coating is then applied in an odd/even pair of sub-chambers. The odd numbered sub-chambers can be used to deposit either the high refractive index material H or the low refractive index material L and the even numbered sub-chambers can be used to deposit the other of the high refractive index material H or the low refractive index material L. The system 800 may also comprise a plurality of ALD optical coating chambers 805 to deposit a plurality of optical coating source materials onto the substrate to form a multilayer optical coating. Each of the plurality of optical coating source materials used to form the multilayer optical coating is provided in a separate ALD optical coating chamber 805.

Figure 9:
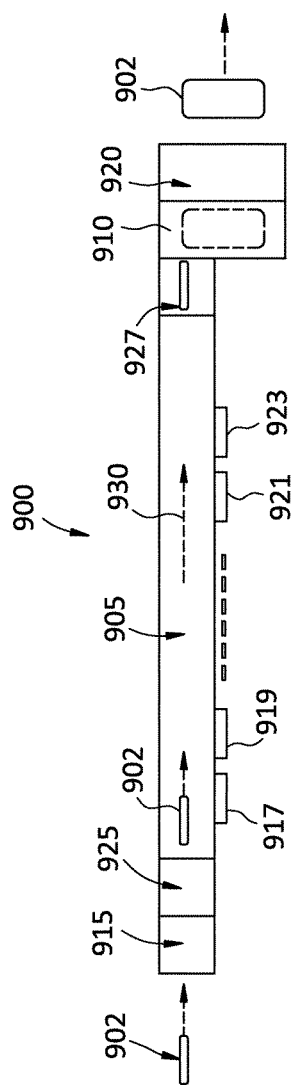
FIG. 9 schematically depicts an inline coating apparatus having multiple chambers.

Referring to FIG. 9, an inline coating apparatus 900 is depicted. The apparatus 900 comprises an optical coating chamber 905, an ETC coating chamber 910, and load lock chambers 915, 920. The optical coating chamber 905 may be used to deposit at least one optical coating source materials onto a substrate 902 to form at least one optical coating. In some embodiments, a plurality of optical coating source materials is deposited onto a substrate 902 to form a multilayer optical coating. Each of the plurality of optical coating source materials used to form the multilayer optical coating is provided in a separate source material container (917, 919, 921, 923). The ETC coating chamber 910 may be used to deposit ETC coating source materials onto the at least one optical coating to form an ETC coating. The load lock chambers 915, 920 may be configured to process one or more substrates, including loading and unloading of one or more substrates into and from the optical coating chamber 905 and the ETC coating chamber 910, while maintaining a vacuum. Pressure matching chambers 925, 927 are located on both sides of the optical coating chamber 905. The pressure matching chambers 925, 927 may assist in allowing the substrate 902 to be loaded into or unloaded from the optical coating chamber 905 and the ETC coating chamber 910, while maintaining a vacuum.

In operation, a substrate 902 is provided to be coated. The substrate 902 has a first surface, a second surface opposite the first surface, and a thickness between the first surface and the second surface. The substrate 902 is horizontally-oriented such that the first surface and the second surface of the substrate 902 are substantially parallel to the transport path of substrate 902 through apparatus 900. The substrate 902 is introduced into the coating apparatus 900 using load lock chamber 915. The substrate 902 is then transferred to pressure matching chamber 925 where the pressure is lowered to create a vacuum that matches the vacuum pressure in the optical coating chamber 905. In some examples, the pressure may be lowered in the load lock chamber 915 to create a vacuum that matches the vacuum pressure in the optical coating chamber 905. The substrate 902 is transported to the optical coating chamber 905 under vacuum using a substrate carrier. Substrate carriers may be used to hold the substrate and transport it through coating chambers 905 and 910, as well as pressure matching chambers 925, 927 and load lock chambers 915 and 920. The chambers 905, 910, 925 and 927 may be evacuated to a pressure of less than or equal to $10^{-4}$ Torr. Optical source materials are deposited onto the substrate 902 to form at least one optical coating in the optical coating chamber 905. The substrate 902 is transported from the optical coating chamber 905 to the ETC coating chamber 910 under vacuum and without exposing the substrate 902 to atmosphere. The substrate 902 is then reoriented such that it is now vertically-oriented, and the first surface and the second surface of the substrate 902 are substantially perpendicular to the transport path of substrate 902 through apparatus 900. ETC coating source materials are deposited onto the optical coating to form an ETC coating in the ETC coating chamber 910. Optionally, the substrate 902 need not be reoriented and ETC coating source materials may be deposited onto the substrate when it is horizontally-oriented, as it is oriented in the optical coating chamber 905. Alternatively, the substrate 902 may be vertically-oriented in the optical coating chamber 905 and may optionally be re-oriented so it is horizontally-oriented in the ETC coating chamber 910. The coated substrate 902 may be then removed from the ETC coating chamber 910 using the substrate carriers to load lock chamber 920 where the pressure may be raised to atmospheric pressure. The coated substrate 902 is then transferred for further processing. The substrate may be loaded and processed in one direction (as shown by the arrow 930). The substrate 902 may be loaded and processed at the same linear speed through the optical coating chamber 905 and/or the ETC coating chamber 910.

As depicted, the optical coating chamber 905 may also be divided into an even number of sub-chambers of from 2 to 10. The coating period of the multilayer optical coating is then applied in an odd/even pair of sub-chambers. The odd numbered sub-chambers can be used to deposit either the high refractive index material H or the low refractive index material L and the even numbered sub-chambers can be used to deposit the other of the high refractive index material H or the low refractive index material L. The apparatus 900 comprises a plurality of optical coating containers 917, 919, 921, 923 for separately holding a plurality of optical coating source materials. Each of the plurality of optical coating source materials may be used to form the multilayer optical coating. In one or more embodiments, the thicknesses of the optical source coating materials deposited onto the substrate may be controlled by controlling the number of optical coating source materials, the type of optical coating source materials, the type of sputter power used, the power intensity used, the type of carrier gas (if any) used during deposition and/or the carrier gas (if any) flow rate during deposition.

The coating apparatus 900 of FIG. 9 may be used in a CVD or PVD coating system. For example, in a CVD system, the ETC coating source materials may be formed on the substrate via thermal evaporation using $N_2$ or Ar carrier gas that is heated to a temperature, for example in the range from about 200° C. to about 600° C. In one option, the equipment (e.g., piping) used to introduce the carrier gas into the ETC coating chamber 910 may also be heated to a temperature in the range from about 200° C. to about 600° C.

The embodiments described herein may be further illustrated by the following non-limiting examples.

Example 1

A 4-layer substrate/$SiO_2$/$Nb_2O_5$/$SiO_2$/$Nb_2O_5$ AR optical coating was deposited on sixty (60) pieces of Gorilla™ Glass (commercially available from Corning Incorporated) whose size (Length, Width, Thickness) was approximately 115 mm L×60 mm W×0.7 mm T. The coating was deposited using the PVD method and had a thickness of approximately 600 nm. (AR coating thickness can be in the range of 100 nm to 2000 nm depending on the intended use of the coated article. In one embodiment the AR coating thickness can be in the range of 400 nm to 1200 nm.) After deposition of the AR coating, the ETC coating was applied on top of the AR coating by thermal evaporation using perfluoroalkyl trichlorosilanes having a carbon chain length in the range of 5 nm to 20 nm (Optool™ fluoro coating, Daikin Industries). The deposition of the AR and ETC coatings were carried out in a single chamber, as illustrated in FIG. 2, in which the after the AR coating was deposited on the glass substrate the AR coating source material(s) was shut off and the ETC material was thermally evaporated and deposited on the AR coated glass. The coating cycle time for the coating process was 73 minutes including parts loading/unloading. Subsequently, water contact angles were determined for three (3) samples before and after the surface was abraded after various abrasion cycles as indicated in Table 1.

Abrasion Test

The abrasion was conducted with #0 steel wool and 1 kg weight load on a 1 $cm^2$ surface area for 3.5, 4.5 and 5.5 thousand (K) cycles. The data in Table 1 indicates that this sample has very good wear and hydrophobic properties.

TABLE 1

| Water Contact Angle-Abrasion Test Results For Three Samples | | | | | | | | | | |
|---|---|---|---|---|---|---|---|---|---|---|
| | Before | | | After Abrasion | | | | | | |
| | Abrasion | | | 3.5K Abrasion | | | 4.5K Abrasion | | 5.5K Abrasion | |
| Angle | 113.8 | 114.2 | 116.1 | 109.9 | 107.2 | 108.5 | 92.6 103.4 96.3 | | 69.5 85.5 | 70.5 |
| Avg. Angle | | 114.7 | | | 108.5 | | 97.4 | | 75.2 | |

Figure 10:
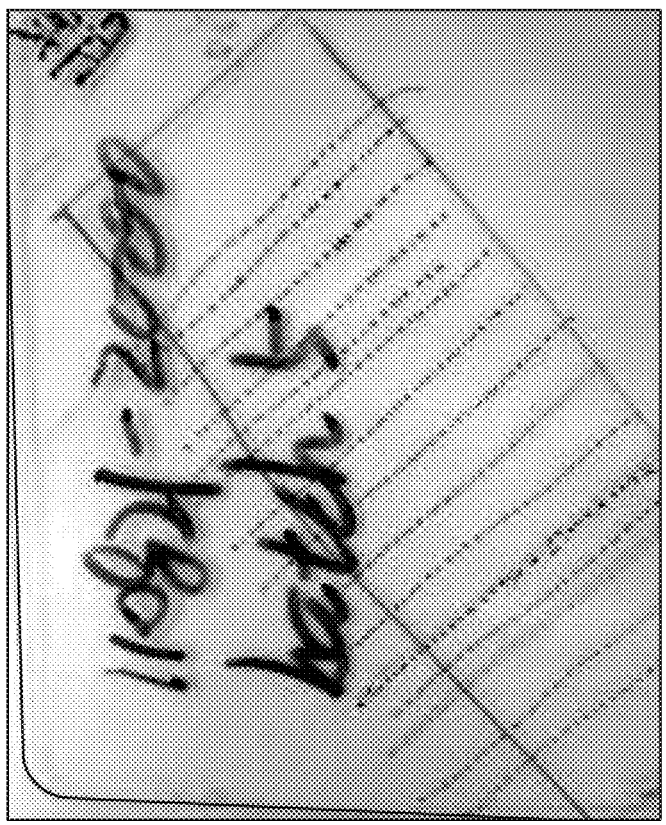
FIG. 10 is a photograph of an ion-exchanged glass substrate having both a multilayer optical coating and an ETC coating after 5500 abrasions using #0 steel wool with a 1 kg applied force on a 1 $cm^2$ surface area (the writing is a sample identification number.

Referring to FIG. 10, the ion-exchanged glass substrate having both the multilayer optical coating and an ETC coating as described above is shown after 5500 abrasions using #0 steel wool with a 1 kg applied force on a 1 $cm^2$ surface area. In FIG. 10, the clarity of the coated glass substrate can be seen after having the abrasion test performed.

Example 2

Figure 11A:
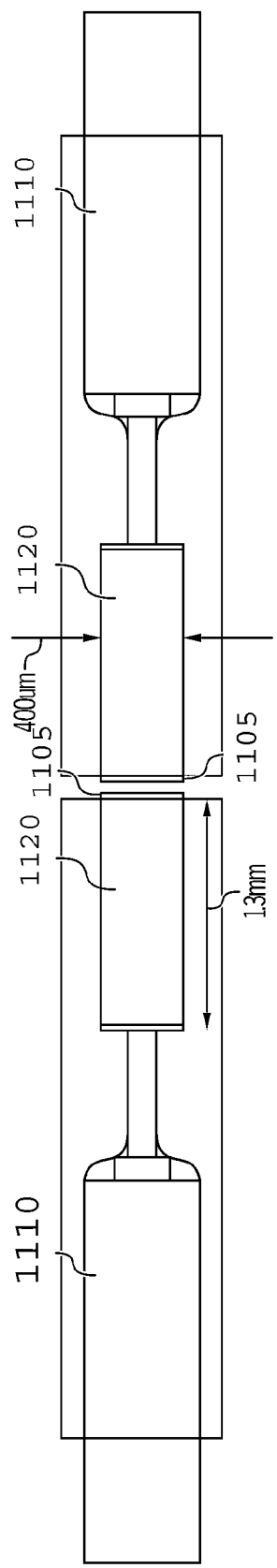
FIGS. 11a-11c is an illustration of AR-ETC coated GRIN lenses 1120 with optical fibers 1110 which may be used, for example, to connect an optical fiber to a laptop or tablet as shown in 1130 or connecting to a media dock as in 1125.
Figure 11C:
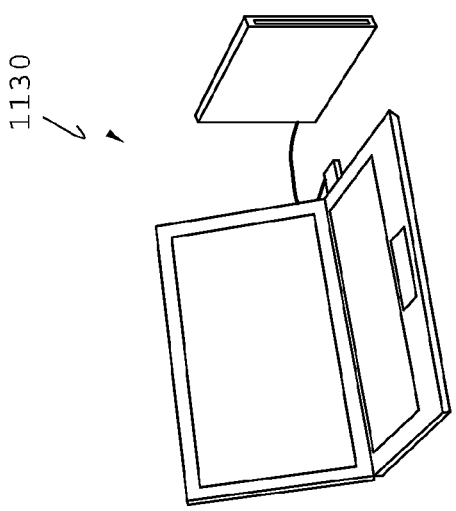
Figure 11B:
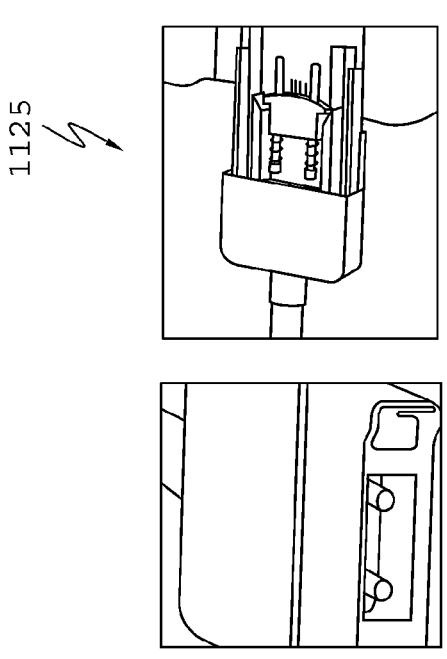

In this Example the same perfluoroalkyl silane trichloride coating used in Example 1 was coated on GRIN-lens for optical connectors, as illustrated in FIGS. 11 a-c, that are used with optical fibers for connecting to laptop computers and other devices. Referring to FIGS. 11 a-c, depicted are optical fibers 1110, and GRIN lenses 1120. The GRIN lenses 1120 have selected coated regions 1105 with an ETC coating formed on an 850 nm AR coating. The diameter of the GRIN lenses 1120 are 400 micrometers and the length is 1.3 mm. The optical fiber may be connected to a media dock as shown in 1125 and/or a laptop or tablet as shown in 1130.

Figure 12:
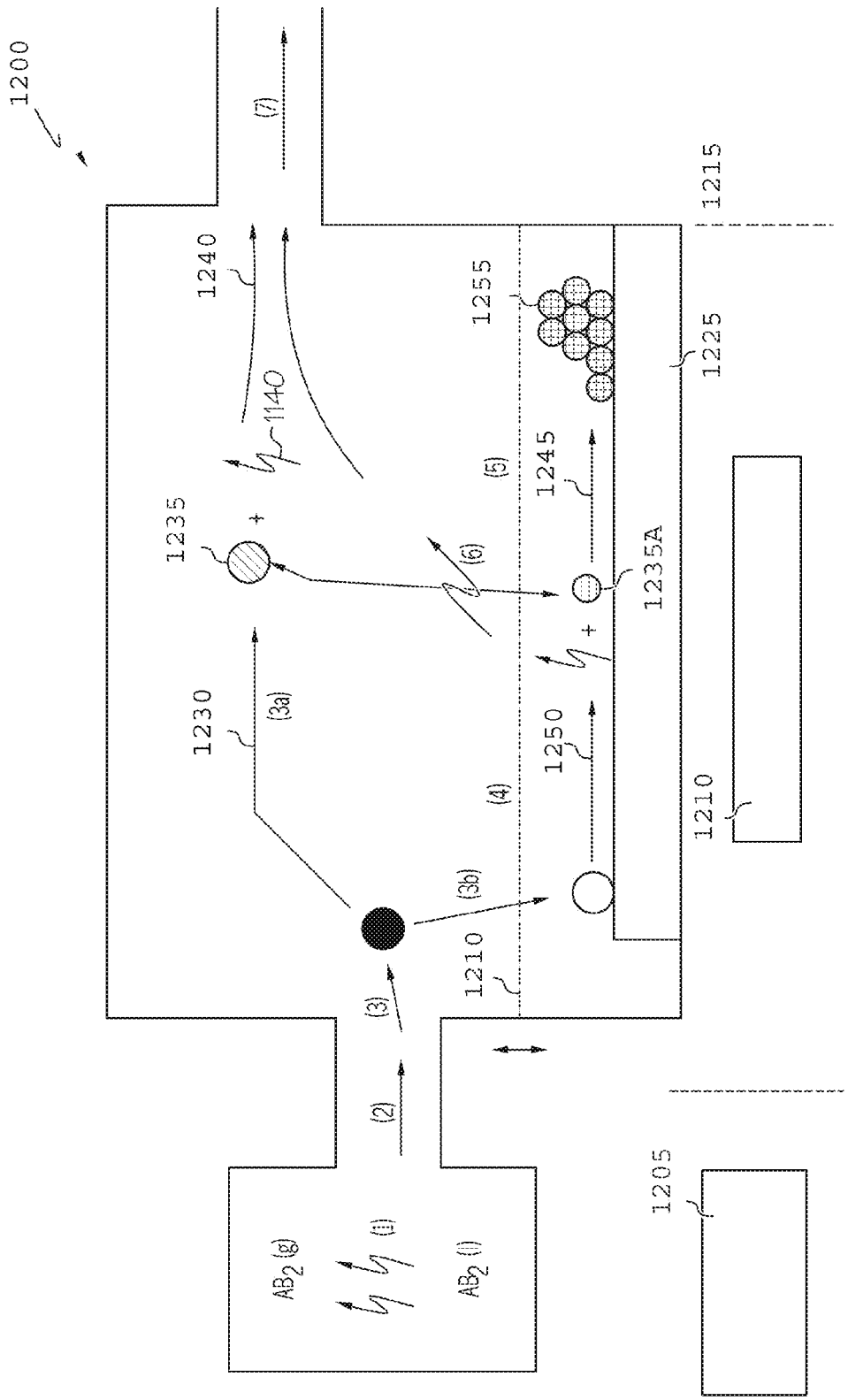
FIG. 12 is a schematic diagram of CVD steps during deposition.

The ETC coating can also be deposited by Chemical Vapor Deposition (CVD) method in which each layer is deposited by feeding in different precursor at elevated temperature or energetic environment (such as plasma). CVD involves the dissociation and/or chemical reactions of gaseous reactants in an activated (heat, light, plasma) environment, followed by the formation of a stable solid product. The deposition involves homogeneous gas phase reactions and/or heterogeneous chemical reactions which occur on/near the vicinity of a heated surface leading to the formation of powders or films, respectively. FIG. 12 illustrates the three main sections of the system which are the vapor precursor feed system 1205, the deposition chamber/reactor 1210 and the effluent gas treatment system 1215; and FIG. 12 further describes the seven key steps of a CVD process, enumerated in FIG. 12 within parentheses (1) to (7), which steps are:

(1) Generation of active gaseous reactant species in the vapor precursor feed system 1205.
(2) Transport of the gaseous species into the reaction chamber.
(3) Gaseous reactants undergo gas phase reactions forming intermediate species, black circle ●; and
   (a) At a high temperature above the decomposition temperatures of intermediate species inside the reactor, a homogeneous gas phase reaction 1230 can occur where the intermediate species (3a) undergo subsequent decomposition and/or chemical reaction, forming powders 1235 and volatile by-products 1240 in the gas phase. The powder will be collected on a substrate 1225 heated surface and may act as crystallization centers 1235a, and the by-products are transported away from the deposition chamber. The deposited film may have poor adhesion.
   (b) At temperatures below the dissociation of the intermediate phase, diffusion/convection of the intermediate species (3b) across the boundary layer 1220 (a thin layer close to the substrate surface) occurs. These intermediate species subsequently undergo steps (4)-(7).
(4) Absorption of gaseous reactants onto the heated substrate 1225, and the heterogeneous reaction 1250 occurs at the gas-solid interface (i.e. heated substrate) which also produces the deposited species and by-product species.

5) The deposits will diffuse along the heated substrate surface as 1250 forming the crystallization center 1235a (along with powder 1235) and then growth 1245 of the crystallization center will occur to form the coating film shown as 1255.

(6) Gaseous by-products are removed from the boundary layer through diffusion or convection.

(7) The unreacted gaseous precursors and by-products will be transported away from the deposition chamber.

In the CVD process, diluted fluorinated ETC material is carried by an inert gas, for example, $N_2$ or argon and deposited in chamber. The ETC coating can be deposited in the same reactor used for deposition of the optical coating or in next reactor inline connected to optical coating reactor if cross contamination or process compatibility is a concern. FIGS. 5, 6 and 7 illustrate systems that use a plurality of coating chambers, including the use of a plurality of chambers for the deposition of the optical coating and a separate chamber for the deposition of the ETC coating. ETC deposition by CVD or thermal evaporation can also be combined with CVD optical coating stack as shown in FIG. 6.

The ETC coating can also be combined with atomic layer deposition (ALD) process as is illustrated in FIG. 8. The ALD method relies on alternate pulsing of the precursor gases and vapors onto the substrate surface and subsequent chemi-sorption or surface reaction of the precursors. The reactor is purged with an inert gas between the precursor pulses. With a proper adjustment of the experimental conditions the process proceeds via saturative (saturation) steps. Under such conditions the growth is stable and the thickness increase is constant in each deposition cycle. The self-limiting growth mechanism facilitates the growth of conformal thin films with accurate thickness on large areas. The growth of different multilayer structures is also straightforward. These advantages make the ALD method attractive for the microelectronics industry for manufacturing of future generation integrated circuits. ALD is a layer-by-layer process, thus it is very well suited to the application of an ETC coating. Following the formation of the optical coating stack, perfluoroalkyl silane pulse is evaporated and carried by $N_2$, and condense onto the article or substrates. This is followed by a pulse of water that will react with perfluoroalkyl silane to form a strong chemical bonding with top oxide layer of the article. The by-product is alcohol or acid, which will be pumped away the reaction chamber. ALD ETC coating can be deposited in the same reactor as is the optical layer stack, or it can be deposited in a different inline reactor following the formation of the optical coating. ETC deposition by either CVD or thermal evaporation can also be combined with ALD optical coating as shown in FIG. 7.

The AR/ETC coating described herein can be utilized by many commercial articles. For example, the resulting coating can be used to make televisions, cell phone, electronic tablets and book readers and other devices readable in sunlight. The AR/ETC coating also have utility antireflection beamsplitters, prisms, mirrors and laser products; optical fibers and components for telecommunication; optical coatings for use in biological and medical applications, and for anti-microbial surfaces.

Aspects of the subject matter described herein relate to processes for making glass articles having an optical coating and an easy-to-clean (ETC) coating on the optical coating using a coating apparatus. The methods may comprise introducing a substrate into a coating apparatus having at least one coating chamber for depositing an optical coating and an ETC coating, the at least one coating chamber comprising at least one source container, lowering the pressure in the at least one coating chamber to less than or equal to $10^{-4}$ Torr to form a vacuum, depositing at least one optical coating source materials onto the substrate to form an optical coating, depositing a ETC coating source materials onto the optical coating to form an ETC coating, removing the substrate from the at least one coating chamber to provide a glass article having the optical coating and the ETC coating, and post-treating the glass article at a temperature of from about 60° C. to about 200° C. for a period of time from about 5 minutes to about 60 minutes to facilitate cross-linking between ETC molecules.

Aspects of the subject matter described herein also relate to processes for making glass articles having an optical coating and an easy-to-clean (ETC) coating on the optical coating. The processes may comprise providing a coating apparatus having at least one coating chamber for deposition of an optical coating and an ETC coating, providing within the at least one coating chamber, optical coating source materials and ETC coating source materials, wherein when a plurality of optical coating source materials are deposited, each of the plurality of optical coating source materials is provided in a separate optical coating source container, providing a substrate to be coated, the substrate having a length, a width and a thickness and at least one edge between surfaces of the substrate defined by the length and width, evacuating the at least one coating chamber to a pressure of less than or equal to $10^{-4}$ Torr, depositing the optical coating source materials on the substrate to form an optical coating, depositing the ETC coating source materials on the optical coating to form an ETC coating, removing the substrate from the at least one coating chamber to provide a glass article having the optical coating and the ETC coating, and post-treating the glass article at a temperature of from about 60° C. to about 200° C. for a period of time from about 5 minutes to about 60 minutes in an air or humid environment having a relative humidity RH of 40%<RH<100% to facilitate cross-linking between ETC molecules, wherein the optical coating is a multilayer coating comprising alternating layers of a high refractive index material H having a refractive index greater than 1.7 and less than or equal to 3.0, and one of (i) a low refractive index material L having a refractive index greater than or equal to 1.3 and less than or equal to 1.6 or (ii) a medium refractive index material M having a refractive index greater than 1.6 and less than or equal to 1.7, laid down in the order H(L or M) or (L or M)H, wherein each H(L or M) or (L or M)H pair of layers is a coating period, and wherein a thickness of an H layer and an (L or M) layer, independent of each other, in each coating period is from about 5 nm to about 200 nm.

In aspects described herein, depositing comprises chemical vapor deposition, plasma enhanced chemical vapor deposition, physical vapor deposition, laser ablation, vacuum arc deposition, thermal evaporation, sputtering, ion-assisted electron beam deposition, or atomic layer deposition. In aspects described herein, the number of coating periods in the multilayer coating is from 2 to 20. In aspects described herein, the multilayer coating has a thickness from about 100 nm to about 2000 nm. In aspects described herein, after post-treating the glass article, the glass article has an average water contact angle of at least 70° after abrasion testing.

In aspects described herein, the optical coating is a multilayer coating comprising alternating layers of a high refractive index material H having a refractive index greater than 1.7 and less than or equal to 3.0, and one of (i) a low refractive index material L having a refractive index greater than or equal to 1.3 and less than or equal to 1.6 or (ii) a medium refractive index material M having a refractive index greater than 1.6 and less than or equal to 1.7, wherein each H(L or M) or (L or M)H pair of layers is a coating period.

In aspects described herein, the high refractive index material H is selected from the group consisting of $ZrO_2$, $HfO_2$, $Ta_2O_5$, $Nb_2O_5$, $TiO_2$, $Y_2O_3$, $Si_3N_4$, $SrTiO_3$, and $WO_3$. In aspects described herein, wherein the low refractive index material L is selected from the group consisting of silica, fused silica, fluorine doped fused silica, $MgF_2$, $CaF_2$, YF, and $YbF_3$, and wherein the medium refractive index material M is $Al_2O_3$.

In aspects described herein, the ETC coating source materials are selected from the group consisting of a perfluoroalkyl silane of formula $(R_F)_y SiX_{4-y}$, where $R_F$ is a linear perfluoroalkyl having a carbon chain length of 6-130 carbon atoms from the silicon atom to an end of the chain at its greatest length, X=Cl, acetoxy, $-OCH_3$ or $-OCH_2CH_3$ and y=1 or 2; and a perfluoropolyether silane of formula $[CF_3-(CF_2CF_2O)_a]_y SiX_{4-y}$ where a is 5-10, y=1 or 2, and X is $-Cl$, acetoxy, $-OCH_3$ or $-OCH_2CH_3$, wherein a total perfluoropolyether chain length is 6-130 carbon atoms from the silicon atom to the end of the chain at its greatest length. In aspects described herein, the thickness of the ETC coating is from about 1 nm to about 20 nm.

In aspects described herein, the optical coating source materials are deposited in a first chamber and the ETC coating source materials are deposited in a second chamber, the first chamber and the second chamber being connected by a vacuum seal/isolation-lock for transferring the substrate from the first chamber to the second chamber without exposing the substrate to atmosphere.

In aspects described herein, the first chamber is divided into an even number of sub-chambers of from 2 to 10, and a coating period of the multilayer optical coating is applied in an odd/even pair of sub-chambers; wherein the odd numbered sub-chambers are used to deposit either the high refractive index material H or the low refractive index material L and the even numbered sub-chambers are used to deposit the other of the high refractive index material H or the low refractive index material L.

In aspects described herein, if a last layer of a last coating period of the optical coating is a high refractive index layer, a capping layer of $SiO_2$ is applied over the high refractive index layer. In aspects described herein, the process may further comprise depositing a $SiO_2$ capping source material onto the optical coating to form a $SiO_2$ capping layer if a last deposited layer of the optical coating is not $SiO_2$ In aspects described herein, the substrate is selected from the group consisting of borosilicate glass, aluminosilicate glass, soda-lime glass, chemically strengthened borosilicate glass, chemically strengthened aluminosilicate glass and chemically strengthened soda-lime glass. In aspects described herein, the substrate has a thickness of from about 0.2 mm to about 1.5 mm. In aspects described herein, the substrate is an aluminosilicate glass having a compressive stress of greater than 400 MPa and a depth of layer greater than 14 μm.

In aspects described herein, the process comprises depositing at least one optical coating source materials in a first coating chamber under vacuum, transferring the substrate from the first coating chamber to a second coating chamber without breaking vacuum, and depositing the ETC coating source materials in the second coating chamber under vacuum. In aspects described herein, the process comprises depositing two or more optical coating source materials layers to form the optical coating, wherein each optical coating source material layer is deposited in a separate coating chamber under vacuum; and transferring the substrate from each of the separate coating chambers without breaking vacuum.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

We claim:

1. A process for vacuum depositing an optical coating and an easy-to-clean (ETC) coating onto a glass substrate, the process comprising:
    providing a coating apparatus having an optical coating chamber for deposition of at least one optical coating and an ETC coating chamber for deposition of an ETC coating;
    introducing a horizontally-oriented glass substrate to be coated into the optical coating chamber under a pressure of less than or equal to $10^{-4}$ Torr, the glass substrate having a first surface, a second surface opposite the first surface, and a thickness between the first surface and the second surface,
    depositing at least one optical coating onto the glass substrate in the optical coating chamber;
    transferring the glass substrate to the ETC coating chamber without breaking vacuum;
    reorienting the glass substrate in the ETC coating chamber such that the glass substrate is vertically-oriented;
    depositing an ETC coating on the at least one optical coating in the ETC coating chamber, the ETC coating selected from the group consisting of fluoroalkylsilanes, perfluoroalkylsilanes, perfluoroalkyl alkyl silanes, perfluoropolyethersilanes, perfluoropolyether alkoxy silanes, perfluoroalkyl alkoxy silanes, fluoroalkylsilane (non fluoroalkylsilane) copolymers, mixtures of fluoroalkylsilanes, and mixtures thereof; and
    removing the glass substrate from the coating apparatus to provide a glass article having the optical coating formed thereon and the ETC coating formed on the optical coating.

2. The process of claim 1, wherein the glass article is post-treated at a temperature of from about 60° C. to about 200° C. for a period of time from about 5 minutes to about 60 minutes to facilitate cross-linking between ETC molecules.

3. The process of claim 1, wherein the at least one optical coating is deposited using inline sputtering.

4. The process of claim 3, wherein during inline sputtering, there is a distance between a sputtering source and the glass substrate, wherein the distance is from about 30 mm to about 100 mm.

5. The process of claim 1, wherein the ETC coating is deposited using chemical vapor deposition, physical vapor deposition, electron beam deposition or thermal evaporation source deposition.

6. The process of claim 1, wherein the optical coating is a multilayer coating comprising alternating layers of a high refractive index material H having a refractive index greater than 1.7 and less than or equal to 3.0, and one of (i) a low refractive index material L having a refractive index greater than or equal to 1.3 and less than or equal to 1.6 or (ii) a medium refractive index material M having a refractive index greater than 1.6 and less than or equal to 1.7, laid down in the order H(L or M) or (L or M)H, wherein each H(L or M) or (L or M)H pair of layers is a coating period; and a thickness of an H layer and an (L or M) layer, independent of each other, in each coating period is from about 5 nm to about 200 nm.

7. The process of claim 6, wherein a number of coating periods in the multilayer coating is from 2 to 20, and the multilayer coating has a thickness from about 100 nm to about 2000 nm.

8. The process of claim 6, wherein if a last layer of a last coating period of the optical coating is a high refractive index layer, a capping layer of $SiO_2$ is applied over the high refractive index layer.

9. The process of claim 1, wherein the ETC coating source materials are selected from the group consisting of:
a perfluoroalkyl silane of formula $(R_F)_y SiX_{4-y}$, where $R_F$ is a linear perfluoroalkyl having a carbon chain length of 6-130 carbon atoms from the silicon atom to an end of the carbon chain at its greatest length, X=Cl, acetoxy, —$OCH_3$ or —$OCH_2H_3$ and y=1 or 2; and
a perfluoropolyether silane.

10. The process of claim 1, wherein a thickness of the ETC coating is from about 1 nm to about 20 nm.

11. The process of claim 1, wherein the optical coating chamber is divided into an even number of sub-chambers of from 2 to 10, and a coating period of a multilayer optical coating is applied in an odd/even pair of sub-chambers;
wherein the odd numbered sub-chambers are used to deposit either a high refractive index material H or a low refractive index material L and the even numbered sub-chambers are used to deposit the other of the high refractive index material H or the low refractive index material L.

12. The process of claim 1, wherein the glass substrate is selected from the group consisting of borosilicate glass, aluminosilicate glass, soda-lime glass, chemically strengthened borosilicate glass, chemically strengthened aluminosilicate glass and chemically strengthened soda-lime glass, and wherein the glass substrate has a thickness of from about 0.2 mm to about 1.5 mm.

13. The process of claim 1, wherein the glass substrate is an aluminosilicate glass having a compressive stress of greater than 400 MPa and a depth of layer greater than 14 µm.

* * * * *

UNITED STATES PATENT AND TRADEMARK OFFICE
CERTIFICATE OF CORRECTION

PATENT NO. : 9,957,609 B2  
APPLICATION NO. : 13/906038  
DATED : May 1, 2018  
INVENTOR(S) : Christopher Morton Lee et al.

Page 1 of 1

It is certified that error appears in the above-identified patent and that said Letters Patent is hereby corrected as shown below:

On the Title Page

On page 2, Column 2, item (56), other publications, Line 15, delete "Mercel" and insert -- Marcel --, therefor.

On page 2, Column 2, item (56), other publications, Line 22, delete "Collioids" and insert -- Colloids --, therefor.

On page 2, Column 2, item (56), other publications, Lines 27, delete ""Durable" and insert -- "Durable --, therefor.

On page 2, Column 2, item (56), other publications, Lines 28, delete "Terminals"";" and insert -- Terminal"; --, therefor.

On page 3, Column 1, item (56), other publications, Line 1, delete ""Deposition" and insert -- "Deposition --, therefor.

On page 3, Column 1, item (56), other publications, Line 1, delete "Enchanced Chemical Vapordeposition" and insert -- Enhanced Chemical Vapor Deposition --, therefor.

On page 3, Column 1, item (56), other publications, Line 3, delete "Coating"";" and insert -- Coating"; --, therefor.

Signed and Sealed this  
Twenty-first Day of January, 2020

Andrei Iancu  
*Director of the United States Patent and Trademark Office*